US012062390B2

(12) United States Patent
Kim

(10) Patent No.: US 12,062,390 B2
(45) Date of Patent: Aug. 13, 2024

(54) APPARATUS AND METHOD FOR CONTROLLING SUPPLY OF POWER FOR REFRESH OPERATION

(71) Applicant: SK hynix Inc., Gyeonggi-do (KR)

(72) Inventor: Woongrae Kim, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 157 days.

(21) Appl. No.: 17/824,303

(22) Filed: May 25, 2022

(65) Prior Publication Data
US 2023/0206981 A1 Jun. 29, 2023

(30) Foreign Application Priority Data

Dec. 27, 2021 (KR) ........................ 10-2021-0188145

(51) Int. Cl.
*G11C 7/00* (2006.01)
*G11C 11/406* (2006.01)
*G11C 11/408* (2006.01)

(52) U.S. Cl.
CPC .... *G11C 11/40615* (2013.01); *G11C 11/4085* (2013.01); *G11C 11/4087* (2013.01)

(58) Field of Classification Search
CPC .......... G11C 11/40615; G11C 11/4085; G11C 11/4087
USPC ....................................................... 365/222
See application file for complete search history.

(56) References Cited

U.S. PATENT DOCUMENTS

| 7,095,670 | B2 * | 8/2006 | Lee ........................ | G11C 11/406 365/236 |
| 7,298,661 | B2 * | 11/2007 | Miyatake .......... | G11C 11/40615 365/222 |
| 7,388,799 | B2 * | 6/2008 | An ..................... | G11C 11/40618 365/228 |
| 7,565,479 | B2 * | 7/2009 | Best ....................... | G11C 11/406 711/108 |
| 7,929,369 | B2 * | 4/2011 | Lee ........................ | G11C 11/406 365/230.06 |
| 8,094,512 | B2 * | 1/2012 | Fukiage ............ | G11C 11/40618 365/230.03 |

(Continued)

FOREIGN PATENT DOCUMENTS

| KR | 10-0624204 B1 | 9/2006 |
| KR | 10-2089665 B1 | 4/2020 |

*Primary Examiner* — Viet Q Nguyen
(74) *Attorney, Agent, or Firm* — IP & T GROUP LLP

(57) ABSTRACT

A memory device includes: a refresh control circuit configured to generate a self-refresh command and a refresh address, word line control circuits configured to control a refresh operation of a plurality of word lines, a group management circuit configured to classify N address groups by grouping the refresh addresses to be generated by the refresh control circuit and to select from the N address groups, a current address group including a refresh address to be currently generated and a subsequent address group including a refresh address to be generated after the current address group according to the predetermined order, a row control circuit configured to group the plurality of word line control circuits with N control signals respectively corresponding to the N address groups, respectively, and a supply control circuit configured to activate signals corresponding to the current and subsequent address groups among the N control signals.

20 Claims, 8 Drawing Sheets

(56) References Cited

U.S. PATENT DOCUMENTS

| | | | |
|---|---|---|---|
| 8,248,879 B2 | 8/2012 | Furutani | |
| 8,885,431 B2 * | 11/2014 | Sato | G11C 11/40622 |
| | | | 365/194 |
| 9,275,717 B2 * | 3/2016 | Jung | G11C 11/40615 |
| 9,484,079 B2 * | 11/2016 | Lee | G11C 11/40626 |
| 10,622,052 B2 * | 4/2020 | Vankayala | G11C 11/40618 |
| 10,957,377 B2 * | 3/2021 | Noguchi | G11C 11/40622 |
| 11,222,686 B1 * | 1/2022 | Noguchi | G11C 7/065 |
| 11,615,831 B2 * | 3/2023 | Yamamoto | G11C 11/40618 |
| | | | 365/222 |
| 2010/0157713 A1 * | 6/2010 | Furutani | G11C 8/06 |
| | | | 365/222 |
| 2014/0064009 A1 * | 3/2014 | Lee | G11C 11/40615 |
| | | | 365/222 |
| 2022/0147277 A1 * | 5/2022 | Oh | G11C 11/40626 |

* cited by examiner

APPARATUS AND METHOD FOR CONTROLLING SUPPLY OF POWER FOR REFRESH OPERATION

CROSS-REFERENCE TO RELATED APPLICATION

This application claims priority under 35 U.S.C. § 119 to Korean Patent Application No. 10-2021-0188145 filed on Dec. 27, 2021, which is incorporated herein by reference in its entirety.

BACKGROUND

1. Field

Various embodiments of the present disclosure relate to a memory device, and specifically, to an apparatus and a method for controlling the supply of power for a refresh operation.

2. Discussion of the Related Art

Recent electronic products have been developed to have a smaller size, a longer operation time, a larger capacity, and more functions according to market demands. Particularly, portable electronic products essentially require low power consumption and a small size. Accordingly, semiconductor devices used in such products are also reduced in power consumption and size.

As a fabricating process is minute and a power supply voltage is reduced, semiconductor devices may be miniaturized. However, in a power-down mode, a leakage current may be increased, and in a normal operation mode, an operation speed may not be increased. In order to address such issues, a power gating technology has been proposed.

The power gating technology is a technology in which a metal oxide semiconductor (MOS) transistor having a relatively high threshold voltage is connected in series between a power supply voltage (or a ground voltage) and a logic circuit, is turned on to supply the power supply voltage (or the ground voltage) to a logic circuit having a relatively low threshold voltage and increase the operation speed of the logic circuit in a normal operation mode (active mode; power-on mode), and is turned off to cut off the logic circuit from the power supply voltage (or the ground voltage) and reduce a leakage current (sub-threshold current) of the logic circuit in a power-down mode.

The power gating technology may be particularly useful for reducing power consumption of large scale integration (LSI) chips for portable devices that spend much longer in the power-down mode than in the normal operation mode. When a power network using such a power gating technology is used, a leakage current may be efficiently restrained in the power-down mode and an operation speed of a logic circuit may be increased by applying an appropriate level of current in the normal operation mode.

A semiconductor memory device for storing data may be roughly classified into a volatile memory device and a nonvolatile memory device. In a volatile memory device such as a dynamic random access memory (DRAM) in which data is stored by charging or discharging a cell capacitor, stored data is retained while power is supplied, but is lost when power is cut off. A nonvolatile memory device may store data even though power is cut off. A volatile memory device is mainly used as a main memory of a computer and the like, and a nonvolatile memory device is used as a large-capacity memory for storing programs and data in a wide range of application devices such as computers and portable communication devices.

A memory cell of a volatile memory device such as a DRAM includes a transistor serving as a switch and a capacitor for storing charge (data). 'High' (logic 1) or 'low' (logic 0) of data is determined according to whether there is charge in the capacitor in the memory cell, that is, whether a terminal voltage of the capacitor is high or low.

Since the storage of data indicates an accumulation of charge in the capacitor, there is no power consumption in principle. However, since the initial amount of charge stored in the capacitor is removed due to a leakage current caused by a PN junction and the like of a transistor, data may be lost. In order to prevent this, it is necessary to read the data in the memory cell before the data is lost and recharge a normal charge amount according to the read information. Only when such an operation is periodically repeated, data is retained. Such a recharge process of cell charge is called a refresh operation (hereinafter, referred to as a normal refresh operation).

The refresh operation may be classified into an auto-refresh operation and a self-refresh operation according to a control method.

The auto-refresh operation may be performed by an auto-refresh command applied from a controller outside a memory device. That is, in the auto-refresh operation, cells connected to a refresh target word line may be refreshed in response to the input of the auto-refresh command from the outside of the memory device.

In the self-refresh operation, only a refresh start command is applied from a controller, and until a refresh end command is applied, a memory device may generate a self-refresh command by itself to perform the refresh operation. That is, in the self-refresh operation, cells connected to a refresh target word line may be refreshed in response to the self-refresh command generated inside the memory device from the start time point to the end time point of the self-refresh operation. Therefore, in the self-refresh operation, a refresh command needs not to be inputted from the controller.

As described above, in the self-refresh operation, a separate command may not be inputted from the outside of the memory device, and the memory device may not perform any operation other than the refresh operation. Accordingly, during a section in which the self-refresh operation is performed, the memory device may supply power only to a circuit for performing the refresh operation, and may not supply power to the other circuits through a power gating technique.

However, as the miniaturization of semiconductor devices is accelerated, an operation of supplying power only to a circuit for performing a refresh operation during a section in which the self-refresh operation is performed may also be a cause of degrading the overall performance of a memory device.

SUMMARY

Various embodiments of the present disclosure are directed to providing an apparatus and a method capable of supplying power only to a circuit for controlling some of a plurality of word lines included in a memory area and not supplying power to a circuit for controlling the remaining word lines even in a self-refresh operation.

In accordance with an embodiment of the present invention, a memory device may include: a refresh control circuit configured to generate a self-refresh command and a refresh address every set cycle in order to refresh cells connected to a plurality of word lines in a predetermined order in a self-refresh section; a plurality of word line control circuits respectively corresponding to the plurality of word lines and each configured to control a refresh operation of the cells connected to a corresponding word line of the plurality of word lines in response to the self-refresh command and the refresh address; a group management circuit configured to: classify refresh addresses to be generated by the refresh control circuit into N refresh address groups by grouping, by a set number, the refresh addresses to be generated by the refresh control circuit, and select, from the N refresh address groups, a current refresh address group including a refresh address to be currently generated by the refresh control circuit during the self-refresh section and a subsequent refresh address group including a refresh address to be generated after the current refresh address group according to the predetermined order; a row control circuit configured to: group the plurality of word line control circuits by the set number, and match the grouped word line control circuits to respective N group control signals respectively corresponding to the N refresh address groups, thereby controlling whether to enable the respective word line control circuits; and a supply control circuit configured to activate two group control signals respectively corresponding to the current and subsequent refresh address groups and deactivate remaining group control signals among the N group control signals during the self-refresh section.

In accordance with an embodiment of the present invention, a method of operating a memory device, the method may include: generating a self-refresh command and a refresh address every set cycle in order to refresh cells connected to a plurality of word lines in a predetermined order in a self-refresh section; classifying refresh addresses to be generated in the predetermined order into N refresh address groups by grouping, by a set number, the refresh addresses to be generated; grouping a plurality of word line control circuits for respectively controlling a plurality of word lines by the set number; matching the grouped word line control circuits to respective N group control signals respectively corresponding to the N refresh address groups, thereby controlling whether to enable the plurality of word line control circuits; selecting, from the N refresh address groups, a current refresh address group including a refresh address to be currently generated during the self-refresh section and a subsequent refresh address group including a refresh address to be generated after the current refresh address group according to the predetermined order; and activating two group control signals respectively corresponding to the current and subsequent refresh address groups and deactivating remaining group control signals among the N group control signals during the self-refresh section, wherein N is a natural number equal to or more than 2.

In accordance with an embodiment of the present invention, a memory device may include: N number of row groups of memory cells; N number of refresh circuits each configured to be activated to sequentially refresh one or more rows within a corresponding row group of the N number of row groups; and a control circuit configured to sequentially activate the N number of refresh circuits in units of groups, one of which includes M number of refresh circuits, while deactivating remaining ones other than each of the activated groups among the N number of refresh circuits. Each of the activated groups may include, among the N number of refresh circuits, one or more current refresh circuits to be currently and sequentially activated and one or more subsequent refresh circuits to be sequentially activated after the current refresh circuits.

The present technology may group a plurality of word lines included in a memory area by a preset number at a self-refresh entry time point, may supply power only to one group selected as a refresh operation target and one group to be selected, and may not supply power to the remaining groups through a power gating technique.

Consequently, it is possible to minimize the amount of required current even in a self-refresh operation.

DETAILED DESCRIPTION

Figure 1:
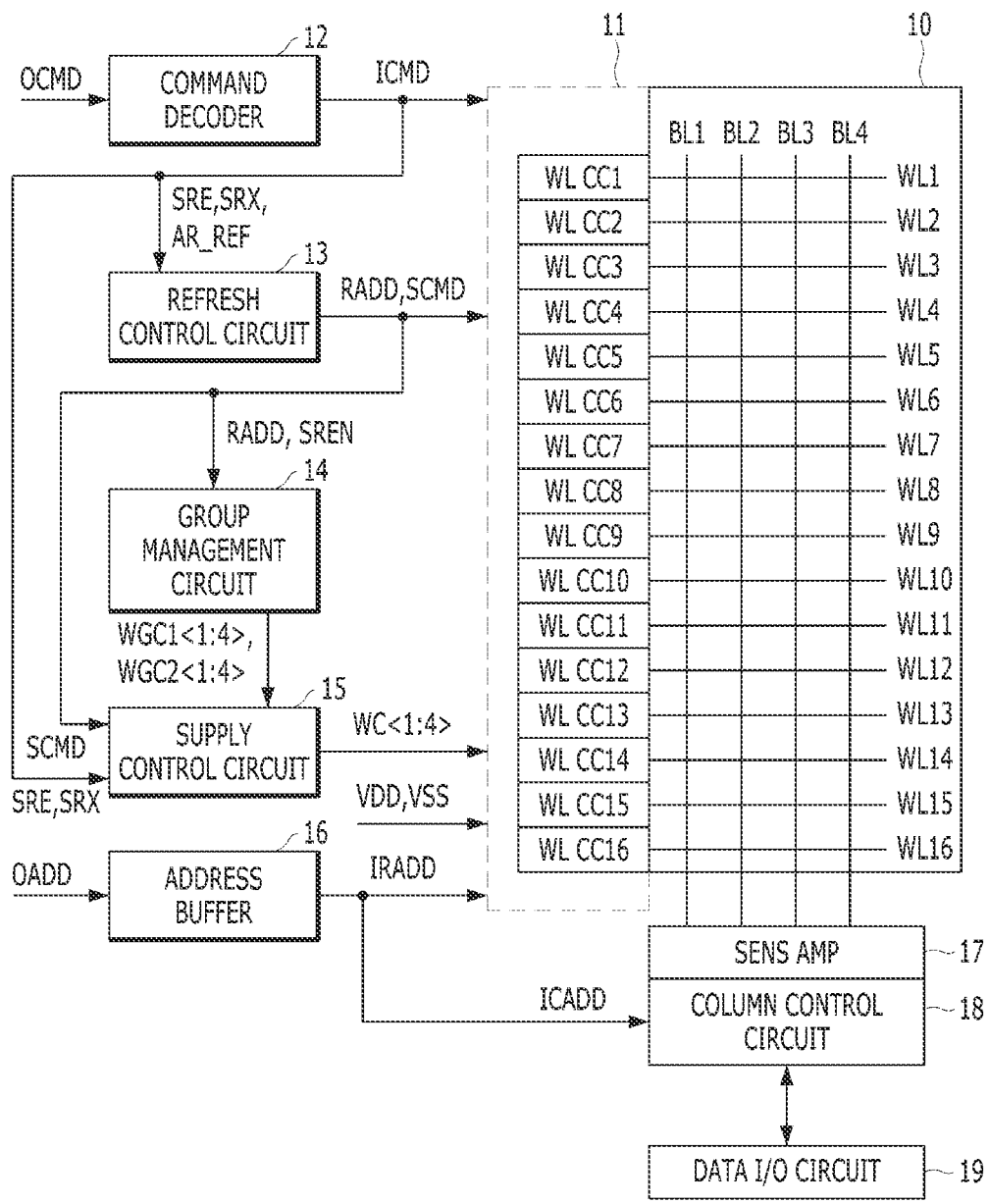
FIG. 1 is a diagram illustrating a memory device in accordance with an embodiment of the present disclosure.

Various embodiments of the present disclosure are described below with reference to the accompanying drawings. Elements and features of the disclosure, however, may be configured or arranged differently to form other embodiments, which may be variations of any of the disclosed embodiments.

In this disclosure, references to various features (e.g., elements, structures, modules, components, steps, operations, characteristics, etc.) included in "one embodiment," "example embodiment," "an embodiment," "another embodiment," "some embodiments," "various embodiments," "other embodiments," "alternative embodiment," and the like are intended to mean that any such features are included in one or more embodiments of the present disclosure, but may or may not necessarily be combined in the same embodiments.

In this disclosure, the terms "comprise," "comprising," "include," and "including" are open-ended. As used in the appended claims, these terms specify the presence of the stated elements and do not preclude the presence or addition of one or more other elements. The terms in a claim do not foreclose the apparatus from including additional components (e.g., an interface unit, circuitry, etc.).

In this disclosure, various units, circuits, or other components may be described or claimed as "configured to" perform a task or tasks. In such contexts, "configured to" is used to connote structure by indicating that the blocks/units/circuits/components include structure (e.g., circuitry) that performs one or more tasks during operation. As such, the block/unit/circuit/component can be said to be configured to perform the task even when the specified block/unit/circuit/component is not currently operational (e.g., is not turned on nor activated). The block/unit/circuit/component used with the "configured to" language includes hardware—for example, circuits, memory storing program instructions executable to implement the operation, etc. Additionally, "configured to" can include a generic structure (e.g., generic circuitry) that is manipulated by software and/or firmware (e.g., an FPGA or a general-purpose processor executing software) to operate in a manner that is capable of performing the task(s) at issue. "Configured to" may also include adapting a manufacturing process (e.g., a semiconductor fabrication facility) to fabricate devices (e.g., integrated circuits) that implement or perform one or more tasks.

As used in this disclosure, the term 'circuitry' or 'logic' refers to all of the following: (a) hardware-only circuit implementations (such as implementations in only analog and/or digital circuitry) and (b) combinations of circuits and software (and/or firmware), such as (as applicable): (i) to a combination of processor(s) or (ii) to portions of processor(s)/software (including digital signal processor(s)), software, and memory(ies) that work together to cause an apparatus, such as a mobile phone or server, to perform various functions and (c) circuits, such as a microprocessor(s) or a portion of a microprocessor(s), that require software or firmware for operation, even if the software or firmware is not physically present. This definition of 'circuitry' or 'logic' applies to all uses of this term in this application, including in any claims. As a further example, as used in this application, the term "circuitry" or "logic" also covers an implementation of merely a processor (or multiple processors) or a portion of a processor and its (or their) accompanying software and/or firmware. The term "circuitry" or "logic" also covers, for example, and if applicable to a particular claim element, an integrated circuit for a storage device.

As used herein, the terms "first," "second," "third," and so on are used as labels for nouns that the terms precede, and do not imply any type of ordering (e.g., spatial, temporal, logical, etc.). The terms "first" and "second" do not necessarily imply that the first value must be written before the second value. Further, although the terms may be used herein to identify various elements, these elements are not limited by these terms. These terms are used to distinguish one element from another element that otherwise have the same or similar names. For example, a first circuitry may be distinguished from a second circuitry.

Further, the term "based on" is used to describe one or more factors that affect a determination. This term does not foreclose additional factors that may affect a determination. That is, a determination may be solely based on those factors or based, at least in part, on those factors. For example, the phrase "determine A based on B." While in this case, B is a factor that affects the determination of A, such a phrase does not foreclose the determination of A from also being based on C. In other instances, A may be determined based solely on B.

Herein, an item of data, a data item, a data entry or an entry of data may be a sequence of bits. For example, the data item may include the contents of a file, a portion of the file, a page in memory, an object in an object-oriented program, a digital message, a digital scanned image, a part of a video or audio signal, metadata or any other entity which can be represented by a sequence of bits. According to an embodiment, the data item may include a discrete object. According to another embodiment, the data item may include a unit of information within a transmission packet between two different components.

FIG. 1 is a diagram illustrating a memory device in accordance with an embodiment of the present disclosure. Hereinafter, a case where the memory device is a DRAM memory device will be described as an example.

Referring to FIG. 1, the memory device may include a memory cell array 10, a row control circuit 11, a sense amplifier SENSE AMP 17, a column control circuit COLUMN CONTROL CIRCUIT 18, a command decoder COMMAND DECODER 12, a refresh control circuit REFRESH CONTROL CIRCUIT 13, a group management circuit GROUP MANAGEMENT CIRCUIT 14, a supply control circuit SUPPLY CONTROL CIRCUIT 15, an address buffer ADDRESS BUFFER 16, and a data input/output circuit DATA I/O CIRCUIT 19.

The memory cell array 10 may include a plurality of memory cells connected between a plurality of word lines WL<1:16> and a plurality of bit lines BL<1:4>. In FIG. 1, the number of word lines is 16 and the number of bit lines is 4, but this is only one example. Actually, a larger number of word lines and bit lines may be included in the memory cell array 10. For reference, the following description is given on that the number of word lines is 16.

The COMMAND DECODER 12 may receive an external command OCMD applied from a controller (not illustrated) outside the memory device, decode the received external command OCMD, and generate internal commands ICMD. The internal commands ICMD may indicate commands for controlling a plurality of operations set to be performed by the memory device. For example, the internal commands ICMD may include a command for an active operation, a command for a read operation, a command for a write operation, an auto-refresh command AR_REF for an auto-refresh operation, an entry command SRE for entering a self-refresh operation, and an exit command SRX for exiting from a self-refresh operation.

The controller may transmit an external address OADD for selecting a memory cell for writing/reading data to the memory device together with the external command OCMD.

The ADDRESS BUFFER 16 may receive the external address OADD applied from the controller, thereby generating a row address IRADD for selecting one of the plurality of word lines WL<1:16> and a column address ICADD for selecting at least one of the plurality of bit lines BL<1:4>.

The row control circuit 11 may decode an address RADD outputted from the REFRESH CONTROL CIRCUIT 13 or an address IADD outputted from the ADDRESS BUFFER 16 in order to select one of the plurality of word lines WL<1:16> included in the memory cell array 10. That is, during a write/read operation, the row control circuit 11 may decode the address IADD outputted from the ADDRESS BUFFER 16, select a word line connected to a memory cell to which data is to be written/read, and drive the selected word line to a predetermined potential level. Furthermore, the row control circuit 11 may decode the address RADD generated by the REFRESH CONTROL CIRCUIT 13, select a word line to be refreshed, and drive the selected word line to a predetermined potential level.

Furthermore, the row control circuit 11 may include a plurality of word line control circuits WL CC<1:16> for controlling operations of the plurality of word lines WL<1:16>, respectively. The plurality of word line control circuits WL CC<1:16> may each receive a power supply voltage VDD and a ground voltage VSS and respectively drive the plurality of word lines WL<1:16> to a predetermined potential level. That is, the row control circuit 11 may select and operate one of the plurality of word line control circuits WL CC<1:16> in order to select one of the plurality of word lines WL<1:16> and drive the selected word line to a predetermined potential level in a write/read operation or a refresh operation.

The SENSE AMP 17 may sense and amplify data of a memory cell connected to the word line selected by the row control circuit 11, and store the data of the memory cell.

The COLUMN CONTROL CIRCUIT 18 may decode the column address ICADD outputted from the ADDRESS BUFFER 16, in order to select a bit line connected to a word line to or from which data is to be inputted or outputted.

The DATA I/O CIRCUIT 19 may output data from a memory cell designated by the addresses IRADD and ICADD in the memory cell array 10, or input data to the memory cell. As a consequence, data inputted through the DATA I/O CIRCUIT 19 may be written in the memory cell array 10 on the basis of the addresses IRADD and ICADD, or data read from the memory cell array 10 may be outputted to the controller through the DATA I/O CIRCUIT 19 on the basis of the addresses IRADD and ICADD.

The REFRESH CONTROL CIRCUIT 13 may generate a refresh address RADD on the basis of the number of executions of a refresh operation so that a refresh operation may be performed on cells respectively connected to the plurality of word lines WL<1:16> in a predetermined order.

Specifically, the refresh operation may be classified into an auto-refresh operation and a self-refresh operation according to a control method.

The auto-refresh operation may be performed by the auto-refresh command AR_REF applied from the controller. That is, in the auto-refresh operation, cells connected to a refresh target word line indicated by a refresh address RADD may be refreshed in response to the auto-refresh command AR_REF inputted from the controller. To this end, the REFRESH CONTROL CIRCUIT 13 may generate a refresh address RADD in response to the auto-refresh command AR_REF inputted from the controller in a section in which the auto-refresh operation is performed. Furthermore, the plurality of word line control circuits WL CC<1:16> included in the row control circuit 11 may control a refresh operation of cells respectively connected to the plurality of word lines WL<1:16> in response to the auto-refresh command AR_REF applied from the controller outside the memory device and the refresh address RADD generated by the REFRESH CONTROL CIRCUIT 13, in an auto-refresh operation section.

In the self-refresh operation, until the entry command SRE for starting the self-refresh operation is applied from the controller and then the exit command SRX for exiting from the self-refresh operation is applied from the controller, the REFRESH CONTROL CIRCUIT 13 may generate a self-refresh command SCMD by itself and perform the refresh operation. That is, in the self-refresh operation, cells connected to a refresh target word line may be refreshed in response to the self-refresh command SCMD generated inside the REFRESH CONTROL CIRCUIT 13 and a refresh address REF_ADD from the start time point to the end time point of the self-refresh operation. To this end, the plurality of word line control circuits WL CC<1:16> included in the row control circuit 11 may control a refresh operation of cells respectively connected to the plurality of word lines WL<1:16> in response to the self-refresh command SCMD and the refresh address RADD applied from the REFRESH CONTROL CIRCUIT 13, in a self-refresh operation section.

As described above, in a section in which the self-refresh operation is performed, the REFRESH CONTROL CIRCUIT 13 may generate the self-refresh command SCMD and the refresh address RADD every set cycle in order to refresh cells connected to the plurality of word lines WL<1:16> in a predetermined order. Accordingly, in the self-refresh operation, there is no need to input a refresh command from the controller to the memory device.

The GROUP MANAGEMENT CIRCUIT 14 may classify refresh addresses RADD to be generated by the REFRESH CONTROL CIRCUIT 13 into N refresh address groups by grouping the refresh addresses RADD by a set number after entering a section in which the self-refresh operation is performed. That is, the GROUP MANAGEMENT CIRCUIT 14 may classify the refresh addresses RADD into the N refresh address groups by decoding a specific bit value RADD<L:M> of a refresh address RADD most recently generated by the REFRESH CONTROL CIRCUIT 13 before entering the self-refresh operation section. The GROUP MANAGEMENT CIRCUIT 14 may classify the refresh addresses RADD into the N refresh address groups by decoding the specific bit value RADD<L:M> of the refresh address RADD, which has been most recently used for a refresh operation in an auto-refresh operation section before entering the self-refresh operation section, at the time of entering the self-refresh operation section.

The row control circuit 11 may group the plurality of word line control circuits WL CC<1:16> by a set number and match the grouped word line control circuits with N group control signals WC<1:4> respectively corresponding to the N refresh address groups, respectively, thereby controlling whether to enable the plurality of word line control circuits WL CC<1:16>. That is, when entering the self-refresh operation section, the row control circuit 11 may group the plurality of word line control circuits WL CC<1:16> by the set number according to the result of decoding the specific bit value RADD<L:M> of the refresh address RADD, which has been most recently generated by the REFRESH CONTROL CIRCUIT 13 before entering the self-refresh operation section, and match the grouped word line control circuits with the N group control signals WC<1:4>, respectively, thereby enabling or disabling the plurality of word line control circuits WL CC<1:16> by the set number. The row control circuit 11 may decode the specific bit value RADD<L:M> of the refresh address RADD, which has been most recently used for the refresh operation in the auto-refresh operation section before entering the self-refresh operation section, at the time of entering the self-refresh operation section, and match the plurality of word line control circuits WL CC<1:16> with the N group control signals WC<1:4>, respectively, by the set number, thereby enabling or disabling the plurality of word line control circuits WL CC<1:16> by the set number.

Specifically, the GROUP MANAGEMENT CIRCUIT 14 may group refresh addresses RADD to be outputted by the REFRESH CONTROL CIRCUIT 13 by the set number, on the basis of the specific bit value RADD<L:M> of the refresh address RADD most recently outputted by the REFRESH CONTROL CIRCUIT 13 before entering the self-refresh operation section, that is, before the entry command SRE is applied from the controller, thereby classifying the refresh addresses RADD into the N refresh address groups.

In accordance with an embodiment, when the specific bit value RADD<L:M> of the refresh address RADD is a value of high-order bits except for the lower-order 1 bit of the refresh address RADD, the GROUP MANAGEMENT CIRCUIT 14 may assume that the set number is 2 and classify two refresh addresses RADD as one refresh address group. In such a case, 16 refresh addresses RADD respectively corresponding to the 16 word lines WL<1:16> may be classified into eight refresh address groups. In such a case, the row control circuit 11 may group the 16 word line control circuits WL CC<1:16> by twos and match the grouped word line control circuits with eight group control signals respectively corresponding to eight refresh address groups, respectively, thereby grouping the 16 word line control circuits WL CC<1:16> into eight word line control circuit groups and determining whether to enable the 16 word line control circuits WL CC<1:16>.

In accordance with another embodiment, when the specific bit value RADD<L:M> of the refresh address RADD is a value of high-order bits except for the lower-order 2 bits of the refresh address RADD, the GROUP MANAGEMENT CIRCUIT 14 may assume that the set number is 4 and classify four refresh addresses RADD as one refresh address group. In such a case, 16 refresh addresses RADD respectively corresponding to the 16 word lines WL<1:16> may be classified into four refresh address groups. In such a case, the row control circuit 11 may group the 16 word line control circuits WL CC<1:16> by fours and match the grouped word line control circuits with four group control signals respectively corresponding to four refresh address groups, respectively, thereby grouping the 16 word line control circuits WL CC<1:16> into four word line control circuit groups and determining whether to enable the 16 word line control circuits WL CC<1:16>.

In accordance with an embodiment, in a state in which the specific bit value RADD<L:M> of the refresh address RADD is a value of high-order bits except for the lower-order 2 bits, the refresh address RADD most recently outputted by the REFRESH CONTROL CIRCUIT 13 before entering the self-refresh operation section is an address indicating a third word line WL3 among the plurality of word lines WL<1:16> and the specific bit value RADD<L:M> of the address indicating the third word line WL3 is the same as the specific bit value RADD<L:M> of an address indicating each of first to fourth word lines WL<1:4>.

Thus, among the plurality of word lines WL<1:16>, the GROUP MANAGEMENT CIRCUIT 14 may classify four refresh addresses RADD indicating the first to fourth word lines WL<1:4> as a first refresh address group, classify four refresh addresses RADD indicating fifth to eighth word lines WL<5:8> as a second refresh address group, classify four refresh addresses RADD indicating ninth to twelfth word lines WL<9:12> as a third refresh address group, and classify four refresh addresses RADD indicating thirteenth to sixteenth word lines WL<13:16> as a fourth refresh address group. Furthermore, among the plurality of word line control circuits WL CC<1:16>, the row control circuit 11 may match first to fourth word line control circuits WL CC<1:4> for controlling the first to fourth word lines WL<1:4> with a first group control signal WC<1>, match fifth to eighth word line control circuits WL CC<5:8> for controlling the fifth to eighth word lines WL<5:8> with a second group control signal WC<2>, match ninth to twelfth word line control circuits WL CC<9:12> for controlling the ninth to twelfth word lines WL<9:12> with a third group control signal WC<3>, and match thirteenth to sixteenth word line control circuits WL CC<13:16> for controlling the thirteenth to sixteenth word lines WL<13:16> with a fourth group control signal WC<4>.

In accordance with another embodiment, in a state in which the specific bit value RADD<L:M> of the refresh address RADD is a value of high-order bits except for the lower-order 2 bits, the refresh address RADD most recently outputted by the REFRESH CONTROL CIRCUIT 13 before entering the self-refresh operation section is an address indicating a ninth word line WL9 among the plurality of word lines WL<1:16> and the specific bit value RADD<L:M> of the address indicating the ninth word line WL9 is the same as the specific bit value RADD<L:M> of an address indicating each of the ninth to twelfth word lines WL<9:12>.

Hence, among the plurality of word lines WL<1:16>, the GROUP MANAGEMENT CIRCUIT 14 may classify four refresh addresses RADD indicating the ninth to twelfth word lines WL<9:12> as a first refresh address group, classify four refresh addresses RADD indicating the thirteenth to sixteenth word lines WL<13:16> as a second refresh address group, classify four refresh addresses RADD indicating the first to fourth word lines WL<1:4> as a third refresh address group, and classify four refresh addresses RADD indicating the fifth to eighth word lines WL<5:8> as a fourth refresh address group. Furthermore, among the plurality of word line control circuits WL CC<1:16>, the row control circuit 11 may match the ninth to twelfth word line control circuits WL CC<9:12> for controlling the ninth to twelfth word lines WL<9:12> with the first group control signal WC<1>, match the thirteenth to sixteenth word line control circuits WL CC<13:16> for controlling the thirteenth to sixteenth word lines WL<13:16> with the second group control signal WC<2>, match the first to fourth word line control circuits WL CC<1:4> for controlling the first to fourth word lines WL<1:4> with the third group control signal WC<3>, and match the fifth to eighth word line control circuits WL CC<5:8> for controlling the fifth to eighth word lines WL<5:8> with the fourth group control signal WC<4>.

Then, the GROUP MANAGEMENT CIRCUIT 14 may select, from the N refresh address groups, a current refresh address group including a refresh address RADD to be currently generated in the section in which the self-refresh operation is performed and a subsequent refresh address group generated in a predetermined order after the current refresh address group.

Then, the SUPPLY CONTROL CIRCUIT 15 may activate two signals corresponding to the current refresh address group and the subsequent refresh address group among the N group control signals WC<1:4> and deactivate the remaining signals in the section in which the self-refresh operation is performed. Consequently, the supply of power to a set number of word line control circuits corresponding to each of the current refresh address group and the subsequent refresh address group among the plurality of word line control circuits WL CC<1:16> may be enabled in response to the two activated group control signals. Furthermore, the supply of power to the remaining word line control circuits except for the current refresh address group and the subsequent refresh address group among the plurality of word line control circuits WL CC<1:16> may be disabled in response to the remaining deactivated group control signals.

In accordance with an embodiment, among the plurality of word lines WL<1:16>, the GROUP MANAGEMENT CIRCUIT 14 classifies four refresh addresses RADD indicating the first to fourth word lines WL<1:4> as a first refresh address group, classifies four refresh addresses RADD indicating the fifth to eighth word lines WL<5:8> as a second refresh address group, classifies four refresh addresses RADD indicating the ninth to twelfth word lines WL<9:12> as a third refresh address group, and classifies four refresh addresses RADD indicating the thirteenth to sixteenth word lines WL<13:16> as a fourth refresh address group.

Thus, when a refresh address RADD currently generated by the REFRESH CONTROL CIRCUIT 13 in the section in which the self-refresh operation is performed is an address RADD indicating a fifth word line WL5, the GROUP MANAGEMENT CIRCUIT 14 may select the second refresh address group including the address RADD indicating the fifth word line WL5 as a current refresh address group, and select, as a subsequent refresh address group, the third refresh address group to be generated after the second refresh address group selected as the current refresh address group. Accordingly, the SUPPLY CONTROL CIRCUIT 15 may activate the second and third group control signals WC<2:3> corresponding to the second refresh address group including the address RADD indicating the fifth word line WL5 and the third refresh address group to be selected after the second refresh address group, and deactivate the remaining first and fourth group control signals WC<1, 4>. Consequently, the supply of power to the fifth to eighth word line control circuits WL CC<5:8> and the ninth to twelfth word line control circuits WL CC<9:12> may be enabled in response to the activated second and third group control signals WC<2:3>. Furthermore, the supply of power to the first to fourth word line control circuits WL CC<1:4> and the thirteenth to sixteenth word line control circuits WL CC<13:16> may be disabled in response to the deactivated first and fourth group control signals WC<1, 4>.

Likewise, when the refresh address RADD currently generated by the REFRESH CONTROL CIRCUIT 13 in the section in which the self-refresh operation is performed is an address RADD indicating a fourteenth word line WL14, the GROUP MANAGEMENT CIRCUIT 14 may select the fourth refresh address group including the address RADD indicating the fourteenth word line WL14 as a current refresh address group, and select, as a subsequent refresh address group, the first refresh address group to be generated after the fourth refresh address group selected as the current refresh address group. Accordingly, the SUPPLY CONTROL CIRCUIT 15 may activate the fourth and first group control signals WC<4, 1> corresponding to the fourth refresh address group including the address RADD indicating the fourteenth word line WL14 and the first refresh address group to be selected after the fourth refresh address group, and deactivate the remaining second and third group control signals WC<2, 3>. Consequently, the supply of power to the thirteenth to sixteenth word line control circuits WL CC<13:16> and the first to fourth word line control circuits WL CC<1:4> may be enabled in response to the activated fourth and first group control signals WC<4, 1>. Furthermore, the supply of power to the fifth to eighth word line control circuits WL CC<5:8> and the ninth to twelfth word line control circuits WL CC<9:12> may be disabled in response to the deactivated second and third group control signals WC<2:3>.

After the self-refresh operation section, before a first refresh address RADD is generated by the REFRESH CONTROL CIRCUIT 13, the SUPPLY CONTROL CIRCUIT 15 may activate the first group control signal WC<1> corresponding to the first refresh address group of the N refresh address groups among the N group control signals WC<1:4>, and deactivate the remaining group control signals WC<2:4>. That is, the SUPPLY CONTROL CIRCUIT 15 may activate the first group control signals WC<1> corresponding to the first refresh address group of the N refresh address groups and deactivate the remaining group control signals WC<2:4> in response to the entry command SRE corresponding to entry into the self-refresh operation section. Consequently, the supply of power to a set number of word line control circuits corresponding to the first refresh address group among the plurality of word line control circuits WL CC<1:16> may be enabled in response to the activated first group control signal WC<1>. Furthermore, the supply of power to a set number of word line control circuits corresponding to the second to N refresh address groups among the plurality of word line control circuits WL CC<1:16> may be disabled in response to the remaining deactivated group control signals WC<2:4>.

Then, the SUPPLY CONTROL CIRCUIT 15 may activate all the N group control signals WC<1:4> in the section in which the auto-refresh operation is performed. That is, the SUPPLY CONTROL CIRCUIT 15 may activate all the N group control signals WC<1:4> in response to exit from the self-refresh section and entry into the auto-refresh section, and then maintain this state until exit from the auto-refresh section and entry into the self-refresh section. That is, the SUPPLY CONTROL CIRCUIT 15 may activate all N group control signals WC<1:4> in response to the exit command SRX applied corresponding to the exit from the self-refresh section, and maintain this state until the entry command SRE corresponding to entry into the self-refresh section is applied. Consequently, in the section in which the auto-refresh operation is performed, the supply of power to the plurality of word line control circuits WL CC<1:16> may be enabled in response to the activated N group control signals WC<1:4>. That is, the supply of power to the plurality of word line control circuits WL CC<1:16> may be enabled in response to exit from the self-refresh section and entry into the auto-refresh section, and then may be maintained until exit from the auto-refresh section and entry into the self-refresh section.

More specifically, the operations of the GROUP MANAGEMENT CIRCUIT 14, the row control circuit 11, and the SUPPLY CONTROL CIRCUIT 15 will be described as follows.

First, the GROUP MANAGEMENT CIRCUIT 14 may classify refresh addresses RADD, which are to be outputted from the REFRESH CONTROL CIRCUIT 13 in a self-refresh section corresponding to an activation section of a self-refresh enable signal SREN, into the N refresh address groups by grouping the refresh addresses RADD by a set number, and generate N current group signals WGC1<1:4> corresponding to the N refresh address groups, respectively. In the above, N may be a natural number equal to or more than 2. Hereinafter, the following description is given on that N is 4.

In accordance with an embodiment, among the plurality of word lines WL<1:16>, the GROUP MANAGEMENT CIRCUIT 14 classifies four refresh addresses RADD indicating the first to fourth word lines WL<1:4> as a first refresh address group, classifies four refresh addresses RADD indicating the fifth to eighth word lines WL<5:8> as a second refresh address group, classifies four refresh addresses RADD indicating the ninth to twelfth word lines WL<9:12> as a third refresh address group, and classifies four refresh addresses RADD indicating the thirteenth to sixteenth word lines WL<13:16> as a fourth refresh address group.

Hence, the GROUP MANAGEMENT CIRCUIT 14 may activate a first current group signal WGC1<1> in response to generation of one of the four refresh addresses RADD, which indicate the first to fourth word lines WL<1:4> and are classified as the first refresh address group, by the REFRESH CONTROL CIRCUIT 13. Furthermore, the GROUP MANAGEMENT CIRCUIT 14 may activate a second current group signal WGC1<2> in response to generation of one of the four refresh addresses RADD, which indicate the fifth to eighth word lines WL<5:8> and are classified as the second refresh address group, by the REFRESH CONTROL CIRCUIT 13. Furthermore, the GROUP MANAGEMENT CIRCUIT 14 may activate a third current group signal WGC1<3> in response to generation of one of the four refresh addresses RADD, which indicate the ninth to twelfth word lines WL<9:12> and are classified as the third refresh address group, by the REFRESH CONTROL CIRCUIT 13. Furthermore, the GROUP MANAGEMENT CIRCUIT 14 may activate a fourth current group signal WGC1<4> in response to generation of one of the four refresh addresses RADD, which indicate the thirteenth to sixteenth word lines WL<13:16> and are classified as the fourth refresh address group, by the REFRESH CONTROL CIRCUIT 13.

In accordance with another embodiment, among the plurality of word lines WL<1:16>, the GROUP MANAGEMENT CIRCUIT 14 may classify four refresh addresses RADD indicating the ninth to twelfth word lines WL<9:12> as a first refresh address group, classifies four refresh addresses RADD indicating the thirteenth to sixteenth word lines WL<13:16> as a second refresh address group, classifies four refresh addresses RADD indicating the first to fourth word lines WL<1:4> as a third refresh address group, and classifies four refresh addresses RADD indicating the fifth to eighth word lines WL<5:8> as a fourth refresh address group.

Thus, the GROUP MANAGEMENT CIRCUIT 14 may activate the first current group signal WGC1<1> in response to generation of one of the four refresh addresses RADD, which indicate the ninth to twelfth word lines WL<9:12> and are classified as the first refresh address group, by the REFRESH CONTROL CIRCUIT 13. Furthermore, the GROUP MANAGEMENT CIRCUIT 14 may activate the second current group signal WGC1<2> in response to generation of one of the four refresh addresses RADD, which indicate the thirteenth to sixteenth word lines WL<13:16> and are classified as the second refresh address group, by the REFRESH CONTROL CIRCUIT 13. Furthermore, the GROUP MANAGEMENT CIRCUIT 14 may activate the third current group signal WGC1<3> in response to generation of one of the four refresh addresses RADD, which indicate the first to fourth word lines WL<1:4> and are classified as the third refresh address group, by the REFRESH CONTROL CIRCUIT 13. Furthermore, the GROUP MANAGEMENT CIRCUIT 14 may activate the fourth current group signal WGC1<4> in response to generation of one of the four refresh addresses RADD, which indicate the fifth to eighth word lines WL<5:8> and are classified as the fourth refresh address group, by the REFRESH CONTROL CIRCUIT 13.

Then, the GROUP MANAGEMENT CIRCUIT 14 may generate N subsequent group signals WGC2<1:4> by signal-shifting the N current group signals WGC1<1:4> corresponding to the N refresh address groups, respectively.

Particularly, the GROUP MANAGEMENT CIRCUIT 14 may activate one of the N current group signals WGC1<1:4> in response to a refresh address RADD currently generated by the REFRESH CONTROL CIRCUIT 13, and signal-shift the activated signal, thereby activating one of the N subsequent group signals WGC2<1:4>.

That is, through the operation of activating one of the N current group signals WGC1<1:4> in response to the refresh address RADD currently generated by the REFRESH CONTROL CIRCUIT 13, the GROUP MANAGEMENT CIRCUIT 14 may perform an operation of selecting a current refresh address group including the currently generated refresh address RADD among the N refresh address groups. Furthermore, through the operation of activating one of the N subsequent group signals WGC2<1:4> by signal-shifting one activated among the N current group signals WGC1<1:4>, the GROUP MANAGEMENT CIRCUIT 14 may perform an operation of selecting a subsequent refresh address group generated after the current refresh address group among the N refresh address groups.

In accordance with an embodiment, among the plurality of word lines WL<1:16>, the GROUP MANAGEMENT CIRCUIT 14 classifies four refresh addresses RADD indicating the first to fourth word lines WL<1:4> as a first refresh address group, classifies four refresh addresses RADD indicating the fifth to eighth word lines WL<5:8> as a second refresh address group, classifies four refresh addresses RADD indicating the ninth to twelfth word lines WL<9:12> as a third refresh address group, and classifies four refresh addresses RADD indicating the thirteenth to sixteenth word lines WL<13:16> as a fourth refresh address group.

Thus, when the refresh address RADD currently generated by the REFRESH CONTROL CIRCUIT 13 in the section in which the self-refresh operation is performed is an address RADD indicating the fifth word line WL5, in order to select, as a current refresh address group, the second refresh address group including the address RADD indicating the fifth word line WL5, the GROUP MANAGEMENT CIRCUIT 14 may activate only a second current group signal WGC1<2> corresponding to the second refresh address group among the four current group signals WGC1<1:4> and deactivate first, third, and fourth current group signals WGC1<1, 3:4> corresponding to the remaining refresh address groups. Furthermore, in order to select, as a subsequent refresh address group, the third refresh address group to be generated after the second refresh address group selected as the current refresh address group, the GROUP MANAGEMENT CIRCUIT 14 may generate four subsequent group signals WGC2<1:4> by signal-shifting the four current group signals WGC1<1:4>, and accordingly, may activate only a second subsequent group signal WGC2<2> corresponding to the third refresh address group among the four subsequent group signals WGC2<1:4> and deactivate first, third, and fourth subsequent group signals WGC2<1, 3:4> corresponding to the remaining refresh address groups.

Likewise, when the refresh address RADD currently generated by the REFRESH CONTROL CIRCUIT 13 in the section in which the self-refresh operation is performed is an address RADD indicating the fourteenth word line WL14, in order to select, as a current refresh address group, the fourth refresh address group including the address RADD indicating the fourteenth word line WL14, the GROUP MANAGEMENT CIRCUIT 14 may activate only a fourth current group signal WGC1<4> corresponding to the fourth refresh address group among the four current group signals WGC1<1:4> and deactivate the first to third current group signals WGC1<1:3> corresponding to the remaining refresh address groups. Furthermore, in order to select, as a subsequent refresh address group, the first refresh address group to be generated after the fourth refresh address group selected as the current refresh address group, the GROUP MANAGEMENT CIRCUIT 14 may generate the four subsequent group signals WGC2<1:4> by signal-shifting the four current group signals WGC1<1:4>, and accordingly, may activate only a fourth subsequent group signal WGC2<4> corresponding to the first refresh address group among the four subsequent group signals WGC2<1:4> and deactivate the first to third subsequent group signals WGC2<1:3> corresponding to the remaining refresh address groups.

Then, the SUPPLY CONTROL CIRCUIT 15 may activate two of the N group control signals WC<1:4> In response to activation of one of the N current group signals WGC1<1:4> and activation of one of the N subsequent group signals WGC2<1:4> by the GROUP MANAGEMENT CIRCUIT 14.

Then, the row control circuit 11 may group the plurality of word line control circuits WL CC<1:16> by a set number and match the grouped word line control circuits with the N group control signals WC<1:4> respectively corresponding to the N refresh address groups, respectively, thereby controlling whether to enable the plurality of word line control circuits WL CC<1:16>. That is, the row control circuit 11 may select enabling or disabling of power supplied to a set number of word lines among the plurality of word lines WL<1:16> in response to one of the N group control signals WC<1:4> outputted from the SUPPLY CONTROL CIRCUIT 15.

Accordingly, an operation, in which the SUPPLY CONTROL CIRCUIT 15 activates one of the N group control signals WC<1:4> as the GROUP MANAGEMENT CIRCUIT 14 activates one of the N current group signals WGC1<1:4>, may be replaced with an operation in which the row control circuit 11 enables power supplied to a set number of word line control circuits corresponding to the current refresh address group among the plurality of word line control circuits WL CC<1:16>.

Likewise, an operation, in which the SUPPLY CONTROL CIRCUIT activates one of the N group control signals WC<1:4> as the GROUP MANAGEMENT CIRCUIT 14 activates one of the N subsequent group signals WGC2<1:4>, may be replaced with an operation in which the row control circuit 11 enables power supplied to a set number of word line control circuits corresponding to the subsequent refresh address group among the plurality of word line control circuits WL CC<1:16>. For reference, since the above description has been made on that the number of word lines is 16, the following description is given on that the number of word line control circuits WL CC<1:16> is also 16.

In accordance with an embodiment, among the plurality of word lines WL<1:16>, the GROUP MANAGEMENT CIRCUIT 14 classifies four refresh addresses RADD indicating the first to fourth word lines WL<1:4> as a first refresh address group, classifies four refresh addresses RADD indicating the fifth to eighth word lines WL<5:8> as a second refresh address group, classifies four refresh addresses RADD indicating the ninth to twelfth word lines WL<9:12> as a third refresh address group, and classifies four refresh addresses RADD indicating the thirteenth to sixteenth word lines WL<13:16> as a fourth refresh address group.

Hence, among the plurality of word line control circuits WL CC<1:16>, the row control circuit 11 may match the first to fourth word line control circuits WL CC<1:4> for controlling the first to fourth word lines WL<1:4> with the first group control signal WC<1>, match the fifth to eighth word line control circuits WL CC<5:8> for controlling the fifth to eighth word lines WL<5:8> with the second group control signal WC<2>, match the ninth to twelfth word line control circuits WL CC<9:12> for controlling the ninth to twelfth word lines WL<9:12> with the third group control signal WC<3>, and match the thirteenth to sixteenth word line control circuits WL CC<13:16> for controlling the thirteenth to sixteenth word lines WL<13:16> with the fourth group control signal WC<4>.

Thus, the GROUP MANAGEMENT CIRCUIT 14 may activate the second current group signal WGC1<2> and deactivate the remaining first, third, and fourth current group signals WGC1<1, 3:4> in order to select the second refresh address group as a current refresh address group. Furthermore, the GROUP MANAGEMENT CIRCUIT 14 may activate the second subsequent group signal WGC2<2> and deactivate the remaining first, third, and fourth subsequent group signals WGC2<1, 3:4> in order to select the third refresh address group as a subsequent refresh address group. Accordingly, the SUPPLY CONTROL CIRCUIT 15 may activate the second and third group control signals WC<2:3> and deactivate the first and fourth group control signals WC<1, 4>. Accordingly, the row control circuit 11 may enable power supplied to the fifth to twelfth control circuits WL CC<5:12> corresponding to the activated second and third group control signals WC<2:3> among the plurality of word line control circuits WL CC<1:16>. Furthermore, the row control circuit 11 may disable power supplied to the first to fourth and thirteenth to sixteenth control circuits WL CC<1:4, 13:16> corresponding to the deactivated first and fourth group control signals WC<1, 4> among the plurality of word line control circuits WL CC<1:16>.

In accordance with another embodiment, among the plurality of word lines WL<1:16>, the GROUP MANAGEMENT CIRCUIT 14 classifies four refresh addresses RADD indicating the ninth to twelfth word lines WL<9:12> as a first refresh address group, classifies four refresh addresses RADD indicating the thirteenth to sixteenth word lines WL<13:16> as a second refresh address group, classifies four refresh addresses RADD indicating the first to fourth word lines WL<1:4> as a third refresh address group, and classifies four refresh addresses RADD indicating the fifth to eighth word lines WL<5:8> as a fourth refresh address group.

Thus, among the plurality of word line control circuits WL CC<1:16>, the row control circuit 11 may match the ninth to twelfth word line control circuits WL CC<9:12> for controlling the ninth to twelfth word lines WL<9:12> with the first group control signal WC<1>, match the thirteenth to sixteenth word line control circuits WL CC<13:16> for controlling the thirteenth to sixteenth word lines WL<13:16> with the second group control signal WC<2>, match the first to fourth word line control circuits WL CC<1:4> for controlling the first to fourth word lines WL<1:4> with the third group control signal WC<3>, and match the fifth to eighth word line control circuits WL CC<5:8> for controlling the fifth to eighth word lines WL<5:8> with the fourth group control signal WC<4>.

Hence, the GROUP MANAGEMENT CIRCUIT 14 may activate the second current group signal WGC1<2> and deactivate the remaining first, third, and fourth current group signals WGC1<1, 3:4> in order to select the second refresh address group as a current refresh address group. Furthermore, the GROUP MANAGEMENT CIRCUIT 14 may activate the second subsequent group signal WGC2<2> and deactivate the remaining first, third, and fourth subsequent group signals WGC2<1, 3:4> in order to select the third refresh address group as a subsequent refresh address group. Accordingly, the SUPPLY CONTROL CIRCUIT 15 may activate the second and third group control signals WC<2:3> and deactivate the first and fourth group control signals WC<1, 4>. Accordingly, the row control circuit 11 may enable power supplied to the thirteenth to sixteenth word line control circuits WL CC<13:16> corresponding to the activated second and third group control signals WC<2:3> and the first to fourth word line control circuits WL CC<1: 4> among the plurality of word line control circuits WL CC<1:16>. Furthermore, the row control circuit 11 may disable power supplied to the fifth to twelfth word line control circuits WL CC<5:12> corresponding to the deactivated first and fourth group control signals WC<1, 4> among the plurality of word line control circuits WL CC<1:16>.

Figure 2:
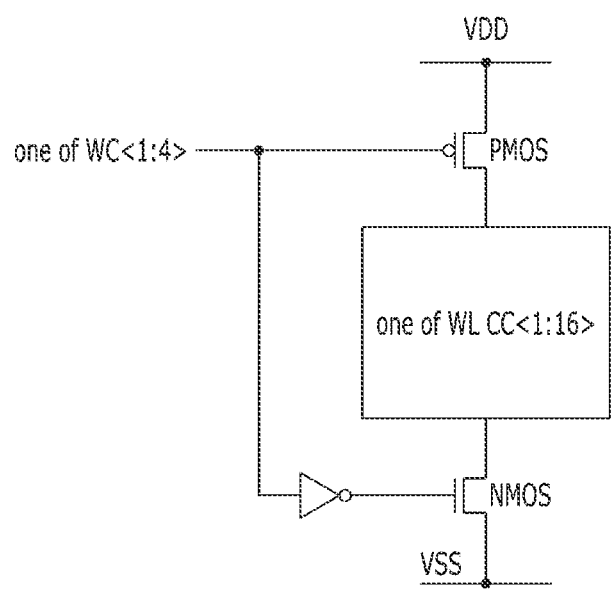
FIG. 2 is a diagram for describing a method in which the memory device in accordance with an embodiment of the present disclosure illustrated in FIG. 1 applies a power gating technique.

FIG. 2 is a diagram for describing a method in which the memory device in accordance with an embodiment of the present disclosure illustrated in FIG. 1 applies a power gating technique.

Referring to FIG. 2, it can be seen that the supply of power VDD and VSS to each of the plurality of word line control circuits WL CC<1:16> included in the row control circuit 11 is enabled or disabled in response to one of the N group control signals WC<1:4>. For reference, since the above description based on FIG. 1 has been made that N is 4, the following description is given on that N is 4.

In accordance with an embodiment, each of the four group control signals WC<1:4> may select whether to enable the power VDD and VSS supplied to four of the 16 word line control circuits WL CC<1:16>. How to match each of the four group control signals WC<1:4> with each of the 16 word line control circuits WL CC<1:16> may vary depending on operations of the GROUP MANAGEMENT CIRCUIT 14 and the row control circuit 11.

As described through the embodiment with reference to FIG. 1, the GROUP MANAGEMENT CIRCUIT 14 may classify 16 addresses indicating the plurality of word lines WL<1:16> into four refresh address groups by referring to the value of the refresh address RADD most recently outputted by the REFRESH CONTROL CIRCUIT 13 before entering the self-refresh operation section. For example, among the plurality of word lines WL<1:16>, the GROUP MANAGEMENT CIRCUIT 14 classifies four refresh addresses RADD indicating the first to fourth word lines WL<1:4> as a first refresh address group, classifies four refresh addresses RADD indicating the fifth to eighth word lines WL<5:8> as a second refresh address group, classifies four refresh addresses RADD indicating the ninth to twelfth word lines WL<9:12> as a third refresh address group, and classifies four refresh addresses RADD indicating the thirteenth to sixteenth word lines WL<13:16> as a fourth refresh address group.

Thus, among the four group control signals WC<1:4>, the row control circuit 11 may match the first group control signal WC<1> with the first to fourth word line control circuits WL CC<1:4>, match the second group control signal WC<2> with the fifth to eighth word line control circuits WL CC<5:8>, match the third group control signal WC<3> with the ninth to twelfth word line control circuits WL CC<9:12>, and match the fourth group control signal WC<4> with the thirteenth to sixteenth word line control circuits WL CC<13:16>. Accordingly, in response to activation or deactivation of the first group control signal WC<1>, the first to fourth word line control circuits WL CC<1:4> may operate to select whether to enable the power VDD and VSS supplied to the first to fourth word lines WL<1:4>. Furthermore, in response to activation or deactivation of the second group control signal WC<2>, the fifth to eighth word line control circuits WL CC<5:8> may operate to select whether to enable the power VDD and VSS supplied to the fifth to eighth word lines WL<5:8>. Furthermore, in response to activation or deactivation of the third group control signal WC<3>, the ninth to twelfth word line control circuits WL CC<9:12> may operate to select whether to enable the power VDD and VSS supplied to the ninth to twelfth word lines WL<9:12>. Furthermore, in response to activation or deactivation of the fourth group control signal WC<4>, the thirteenth to sixteenth word line control circuits WL CC<13:16> may operate to select whether to enable the power VDD and VSS supplied to the thirteenth to sixteenth word lines WL<13:16>.

As described through the another embodiment with reference to FIG. 1, the GROUP MANAGEMENT CIRCUIT 14 may classify 16 addresses indicating the plurality of word lines WL<1:16> into four refresh address groups by referring to the value of the refresh address RADD most recently outputted by the REFRESH CONTROL CIRCUIT 13 before entering the self-refresh operation section. For example, among the plurality of word lines WL<1:16>, the GROUP MANAGEMENT CIRCUIT 14 classifies four refresh addresses RADD indicating the ninth to twelfth word lines WL<9:12> as a first refresh address group, classifies four refresh addresses RADD indicating the thirteenth to sixteenth word lines WL<13:16> as a second refresh address group, classifies four refresh addresses RADD indicating the first to fourth word lines WL<1:4> as a third refresh address group, and classifies four refresh addresses RADD indicating the fifth to eighth word lines WL<5:8> as a fourth refresh address group.

Hence, among the four group control signals WC<1:4>, the row control circuit 11 may match the first group control signal WC<1> with the ninth to twelfth word line control circuits WL CC<9:12>, match the second group control signal WC<2> with the thirteenth to sixteenth word line control circuits WL CC<13:16>, match the third group control signal WC<3> with the first to fourth word line control circuits WL CC<1:4>, and match the fourth group control signal WC<4> with the fifth to eighth word line control circuits WL CC<5:8>. Accordingly, in response to activation or deactivation of the first group control signal WC<1>, the ninth to twelfth word line control circuits WL CC<9:12> may operate to select whether to enable the power VDD and VSS supplied to the ninth to twelfth word lines WL<9:12>. Furthermore, in response to activation or deactivation of the second group control signal WC<2>, the thirteenth to sixteenth word line control circuits WL CC<13: 16> may operate to select whether to enable the power VDD and VSS supplied to the thirteenth to sixteenth word lines WL<13:16>. Furthermore, in response to activation or deactivation of the third group control signal WC<3>, the first to fourth word line control circuits WL CC<1:4> may operate to select whether to enable the power VDD and VSS supplied to the first to fourth word lines WL<1:4>. Furthermore, in response to activation or deactivation of the fourth group control signal WC<4>, the fifth to eighth word line control circuits WL CC<5:8> may operate to select whether to enable the power VDD and VSS supplied to the fifth to eighth word lines WL<5:8>.

Further, each of the 16 word line control circuits WLCC<1:16> may include a PMOS transistor and an NMOS transistor, enable the supplied power VDD and VSS in response to the matched group control signals WC<1:4> being activated to logic low, and disable the supplied power VDD and VSS in response to the matched group control signals WC<1:4> being deactivated to logic high.

Figure 3:
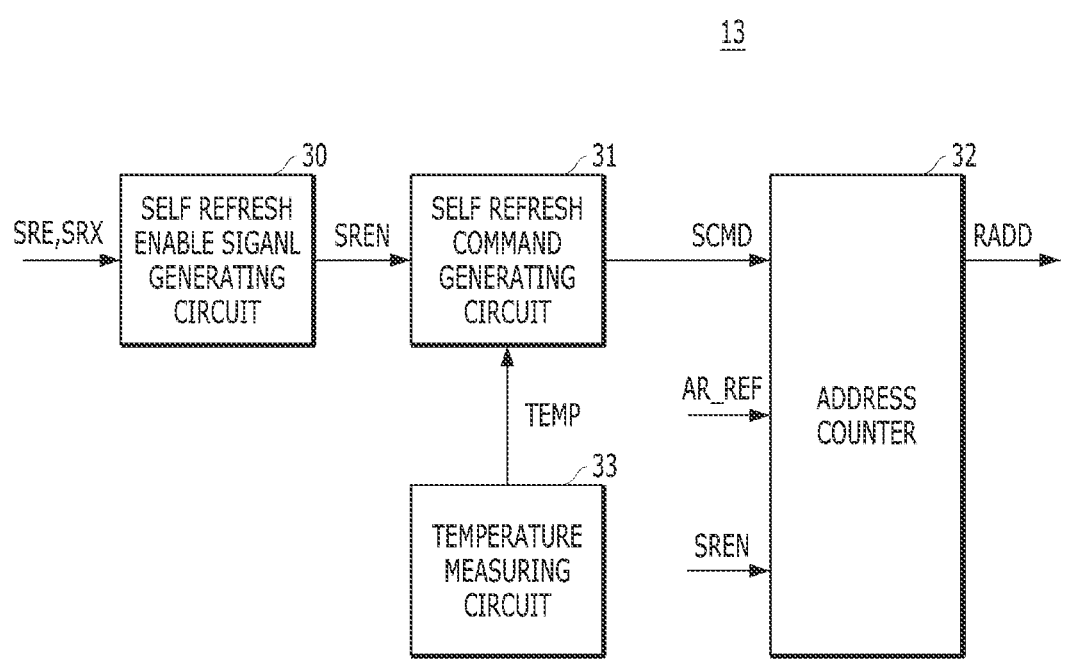
FIG. 3 is a diagram schematically illustrating the structure of a refresh control circuit among components of the memory device in accordance with an embodiment of the present disclosure illustrated in FIG. 1.

FIG. 3 is a diagram schematically illustrating the structure of the refresh control circuit among the components of the memory device in accordance with an embodiment of the present disclosure illustrated in FIG. 1.

The REFRESH CONTROL CIRCUIT 13 in accordance with an embodiment of the present disclosure may include a self refresh enable signal generating circuit SELF REFRESH ENABLE SIGNAL GENERATING CIRCUIT 30, a self refresh command generating circuit SELF REFRESH COMMAND GENERATING CIRCUIT 31, an address counter ADDRESS COUNTER 32, and a temperature measuring circuit TEMPERATURE MEASURING CIRCUIT 33.

The SELF REFRESH ENABLE SIGNAL GENERATING CIRCUIT 30 may generate the self-refresh enable signal SREN in response to the entry command SRE for entering the self-refresh operation and the exit command SRX for exiting from the self-refresh operation, which are generated by the COMMAND DECODER 12 (see FIG. 1) included in the memory device. In accordance with an embodiment, the SELF REFRESH ENABLE SIGNAL GENERATING CIRCUIT 30 may activate the self-refresh enable signal SREN in response to the reception of the entry command SRE, and deactivate the self-refresh enable signal SREN in response to the reception of the exit command SRX.

The SELF REFRESH COMMAND GENERATING CIRCUIT 31 may generate the self-refresh command SCMD every set cycle in the self-refresh section in which the self-refresh enable signal SREN is activated. The set cycle may be varied in response to a temperature information signal TEMP applied by the TEMPERATURE MEASURING CIRCUIT 33.

The ADDRESS COUNTER 32 may generate a refresh address RADD in response to the self-refresh command SCMD during the self-refresh section in which the self-refresh enable signal SREN is activated. That is, the ADDRESS COUNTER 32 may increase the value of the refresh address RADD through up-counting whenever the self-refresh command SCMD is inputted during the self-refresh section.

Furthermore, the ADDRESS COUNTER 32 may generate a refresh address RADD in response to the auto-refresh command AR_REF generated by the COMMAND DECODER 12 (see FIG. 1) included in the memory device during the auto-refresh section in which the self-refresh enable signal SREN is deactivated. That is, the ADDRESS COUNTER 32 may increase the value of the refresh address RADD through up-counting whenever the auto-refresh command AR_REF is inputted during the auto-refresh section.

Although not illustrated specifically in the drawing, the ADDRESS COUNTER 32 may check the number of inputs of the self-refresh command SCMD or the auto-refresh command AR_REF, and initialize the value of the refresh address RADD every prescribed cycle so that all cells connected to a plurality of word lines included in a memory area are refreshed once according to the check result.

In accordance with an embodiment, when the number of word lines included in the memory area is 8,096, the sum of the number of self-refresh commands SCMD generated by the SELF REFRESH COMMAND GENERATING CIRCUIT 31 and the number of auto-refresh commands AR_REF generated by the COMMAND DECODER 12 (see FIG. 1) may be 8,096. In such a case, the ADDRESS COUNTER 32 may initialize the value of the refresh address RADD whenever the sum of the number of self-refresh commands SCMD generated by the SELF REFRESH COMMAND GENERATING CIRCUIT 31 and the number of auto-refresh commands AR_REF inputted from the controller outside the memory device is 8,096.

The TEMPERATURE MEASURING CIRCUIT 33 may generate the temperature information signal TEMP by measuring the operation temperature of the memory device every predetermined time point. The predetermined time point may be a time interval determined in advance by a designer according to the type or characteristics of the memory device, for example, the number of word lines included in the memory area.

Figure 4:
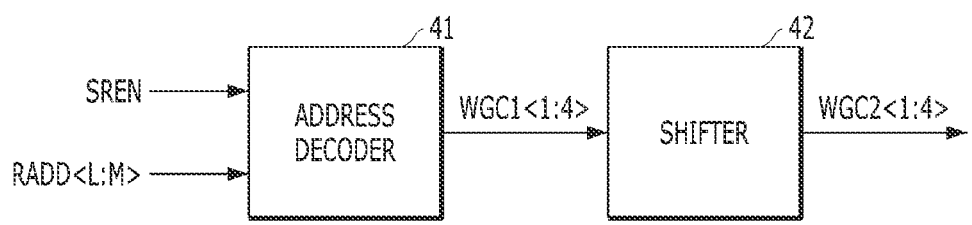
FIG. 4 is a diagram schematically illustrating the structure of a group management circuit among the components of the memory device in accordance with an embodiment of the present disclosure illustrated in FIG. 1.

FIG. 4 is a diagram schematically illustrating the structure of the group management circuit among the components of the memory device in accordance with an embodiment of the present disclosure illustrated in FIG. 1.

As described with reference to FIG. 1, after entering a section in which the self-refresh operation is performed, the GROUP MANAGEMENT CIRCUIT 14 may classify refresh addresses RADD to be generated by the REFRESH CONTROL CIRCUIT 13 into the N refresh address groups by grouping the refresh addresses RADD by a set number. That is, the GROUP MANAGEMENT CIRCUIT 14 may classify the refresh addresses RADD into the N refresh address groups on the basis of the specific bit value RADD<L:M> of the refresh address RADD most recently generated by the REFRESH CONTROL CIRCUIT 13 before entering the self-refresh operation section. At this time, the GROUP MANAGEMENT CIRCUIT 14 may generate the N current group signals WGC1<1:4> corresponding to the N refresh address groups, respectively, and generate the N subsequent group signals WGC2<1:4> by signal-shifting the N current group signals WGC1<1:4>. For reference, since the aforementioned description has been made on that N is 4, the following description is given on that N is 4.

Referring to FIG. 4, the GROUP MANAGEMENT CIRCUIT 14 may include an address decoder ADDRESS DECODER 41 and a shifter SHIFTER 42.

The ADDRESS DECODER 41 included in the GROUP MANAGEMENT CIRCUIT 14 may classify the refresh addresses RADD into the N refresh address groups on the basis of the specific bit value RADD<L:M> of the refresh address RADD most recently generated by the REFRESH CONTROL CIRCUIT 13 before entering the self-refresh operation section in response to the self-refresh enable signal SREN. Furthermore, the ADDRESS DECODER 41 may generate the N current group signals WGC1<1:4> indicating the N refresh address groups, respectively, by decoding a specific bit value RADD<L:M> of a currently generated address, thereby activating only one signal indicating a current refresh address group selected by the specific bit value RADD<L:M> of the currently generated address among the N current group signals WGC1<1:4> and deactivating the remaining N−1 signals.

In accordance with an embodiment, the specific bit value RADD<L:M> of the refresh address RADD most recently generated by the REFRESH CONTROL CIRCUIT 13 before entering the self-refresh operation section is the same as the specific bit value RADD<L:M> of an address indicating each of the first to fourth word lines WL<1:4> among the plurality of word lines WL<1:16>.

In such a case, among the plurality of word lines WL<1:16>, the ADDRESS DECODER 41 may classify four refresh addresses RADD indicating the first to fourth word lines WL<1:4> as a first refresh address group and allow the first refresh address group to correspond to the first current group signal WGC1<1>, classify four refresh addresses RADD indicating the fifth to eighth word lines WL<5:8> as a second refresh address group and allow the second refresh address group to correspond to the second current group signal WGC1<2>, classify four refresh addresses RADD indicating the ninth to twelfth word lines WL<9:12> as a third refresh address group and allow the third refresh address group to correspond to the third current group signal WGC1<3>, and classify four refresh addresses RADD indicating the thirteenth to sixteenth word lines WL<13:16> as a fourth refresh address group and allow the fourth refresh address group to correspond to the fourth current group signal WGC1<4>.

That is, when the specific bit value RADD<L:M> of the refresh address RADD currently generated by the REFRESH CONTROL CIRCUIT 13 is the same as the specific bit value RADD<L:M> of the address indicating each of the first to fourth word lines WL<1:4>, the ADDRESS DECODER 41 may activate the first current group signal WGC1<1> and deactivate the remaining current group signals WGC1<2:4>. Furthermore, when the specific bit value RADD<L:M> of the refresh address RADD currently generated by the REFRESH CONTROL CIRCUIT 13 is the same as the specific bit value RADD<L:M> of the address indicating each of the fifth to eighth word lines WL<5:8>, the ADDRESS DECODER 41 may activate the second current group signal WGC1<2> and deactivate the remaining current group signals WGC1<1, 3:4>. Furthermore, when the specific bit value RADD<L:M> of the refresh address RADD currently generated by the REFRESH CONTROL CIRCUIT 13 is the same as the specific bit value RADD<L:M> of the address indicating each of the ninth to twelfth word lines WL<9:12>, the ADDRESS DECODER 41 may activate the third current group signal WGC1<3> and deactivate the remaining current group signals WGC1<1:2, 4>. Furthermore, when the specific bit value RADD<L:M> of the refresh address RADD currently generated by the REFRESH CONTROL CIRCUIT 13 is the same as the specific bit value RADD<L:M> of the address indicating each of the thirteenth to sixteenth word lines WL<13:16>, the ADDRESS DECODER 41 may activate the fourth current group signal WGC1<4> and deactivate the remaining current group signals WGC1<1:3>.

In accordance with another embodiment, the specific bit value RADD<L:M> of the refresh address RADD most recently generated by the REFRESH CONTROL CIRCUIT 13 before entering the self-refresh operation section is the same as the specific bit value RADD<L:M> of an address indicating each of the ninth to twelfth word lines WL<9:12> among the plurality of word lines WL<1:16>.

In such a case, among the plurality of word lines WL<1:16>, the ADDRESS DECODER 41 may classify four refresh addresses RADD indicating the ninth to twelfth word lines WL<9:12> as a first refresh address group and allow the first refresh address group to correspond to the first current group signal WGC1<1>, classify four refresh addresses RADD indicating the thirteenth to sixteenth word lines WL<13:16> as a second refresh address group and allow the second refresh address group to correspond to the second current group signal WGC1<2>, classify four refresh addresses RADD indicating the first to fourth word lines WL<1:4> as a third refresh address group and allow the third refresh address group to correspond to the third current group signal WGC1<3>, and classify four refresh addresses RADD indicating the fifth to eighth word lines WL<5:8> as a fourth refresh address group and allow the fourth refresh address group to correspond to the fourth current group signal WGC1<4>.

That is, when the specific bit value RADD<L:M> of the refresh address RADD currently generated by the REFRESH CONTROL CIRCUIT 13 is the same as the specific bit value RADD<L:M> of the address indicating each of the ninth to twelfth word lines WL<9:12>, the ADDRESS DECODER 41 may activate the first current group signal WGC1<1> and deactivate the remaining current group signals WGC1<2:4>. Furthermore, when the specific bit value RADD<L:M> of the refresh address RADD currently generated by the REFRESH CONTROL CIRCUIT 13 is the same as the specific bit value RADD<L:M> of the address indicating each of the thirteenth to sixteenth word lines WL<13:16>, the ADDRESS DECODER 41 may activate the second current group signal WGC1<2> and deactivate the remaining current group signals WGC1<1, 3:4>. Furthermore, when the specific bit value RADD<L:M> of the refresh address RADD currently generated by the REFRESH CONTROL CIRCUIT 13 is the same as the specific bit value RADD<L:M> of the address indicating each of the first to fourth word lines WL<1:4>, the ADDRESS DECODER 41 may activate the third current group signal WGC1<3> and deactivate the remaining current group signals WGC1<1:2, 4>. Furthermore, when the specific bit value RADD<L:M> of the refresh address RADD currently generated by the REFRESH CONTROL CIRCUIT 13 is the same as the specific bit value RADD<L:M> of the address indicating each of the fifth to eighth word lines WL<5:8>, the ADDRESS DECODER 41 may activate the fourth current group signal WGC1<4> and deactivate the remaining current group signals WGC1<1:3>.

Then, the SHIFTER 42 included in the GROUP MANAGEMENT CIRCUIT 14 may generate the N subsequent group signals WGC2<1:4> indicating the N refresh address groups, respectively, by signal-shifting the N current group signals WGC1<1:4>, thereby activating only one signal indicating the subsequent refresh address group generated after the current refresh address group among the N subsequent group signals WGC2<1:4> and deactivating the remaining N−1 signals.

In accordance with an embodiment, among the plurality of word lines WL<1:16>, the ADDRESS DECODER 41 classifies four refresh addresses RADD indicating the first to fourth word lines WL<1:4> as a first refresh address group and allow the first refresh address group to correspond to the first current group signal WGC1<1>, classifies four refresh addresses RADD indicating the fifth to eighth word lines WL<5:8> as a second refresh address group and allow the second refresh address group to correspond to the second current group signal WGC1<2>, classifies four refresh addresses RADD indicating the ninth to twelfth word lines WL<9:12> as a third refresh address group and allow the third refresh address group to correspond to the third current group signal WGC1<3>, and classifies four refresh addresses RADD indicating the thirteenth to sixteenth word lines WL<13:16> as a fourth refresh address group and allow the fourth refresh address group to correspond to the fourth current group signal WGC1<4>.

Thus, since the SHIFTER 42 generates the subsequent group signals WGC2<1:4> by signal-shifting the current group signals WGC1<1:4>, the first subsequent group signal WGC2<1> may correspond to the second refresh address group indicating the fifth to eighth word lines WL<5:8>, the second subsequent group signal WGC2<2> may correspond to the third refresh address group indicating ninth to twelfth word lines WL<9:12>, the third subsequent group signal WGC2<3> may correspond to the fourth refresh address group indicating thirteenth to sixteenth word lines WL<13:16>, and the fourth subsequent group signal WGC2<4> may correspond to the first refresh address group indicating first to fourth word lines WL<1:4>.

Accordingly, when the ADDRESS DECODER 41 activates the first current group signal WGC1<1> and deactivates the remaining current group signals WGC1<2:4> in order to select the first refresh address group as a current refresh address group, the SHIFTER 42 may activate the first subsequent group signal WGC2<1> and deactivate the remaining subsequent group signals WGC2<2:4> in order to select the second refresh address group as a subsequent refresh address group. Furthermore, when the ADDRESS DECODER 41 activates the second current group signal WGC1<2> and deactivates the remaining current group signals WGC1<1, 3:4> in order to select the second refresh address group as a current refresh address group, the SHIFTER 42 may activate the second subsequent group signal WGC2<2> and deactivate the remaining subsequent group signals WGC2<1, 3:4> in order to select the third refresh address group as a subsequent refresh address group. Furthermore, when the ADDRESS DECODER 41 activates the third current group signal WGC1<3> and deactivates the remaining current group signals WGC1<1:2, 4> in order to select the third refresh address group as a current refresh address group, the SHIFTER 42 may activate the third subsequent group signal WGC2<3> and deactivate the remaining subsequent group signals WGC2<1:2, 4> in order to select the fourth refresh address group as a subsequent refresh address group. Furthermore, when the ADDRESS DECODER 41 activates the fourth current group signal WGC1<4> and deactivates the remaining current group signals WGC1<1:3> in order to select the fourth refresh address group as a current refresh address group, the SHIFTER 42 may activate the fourth subsequent group signal WGC2<4> and deactivate the remaining subsequent group signals WGC2<1:3> in order to select the first refresh address group as a subsequent refresh address group.

Figure 5:
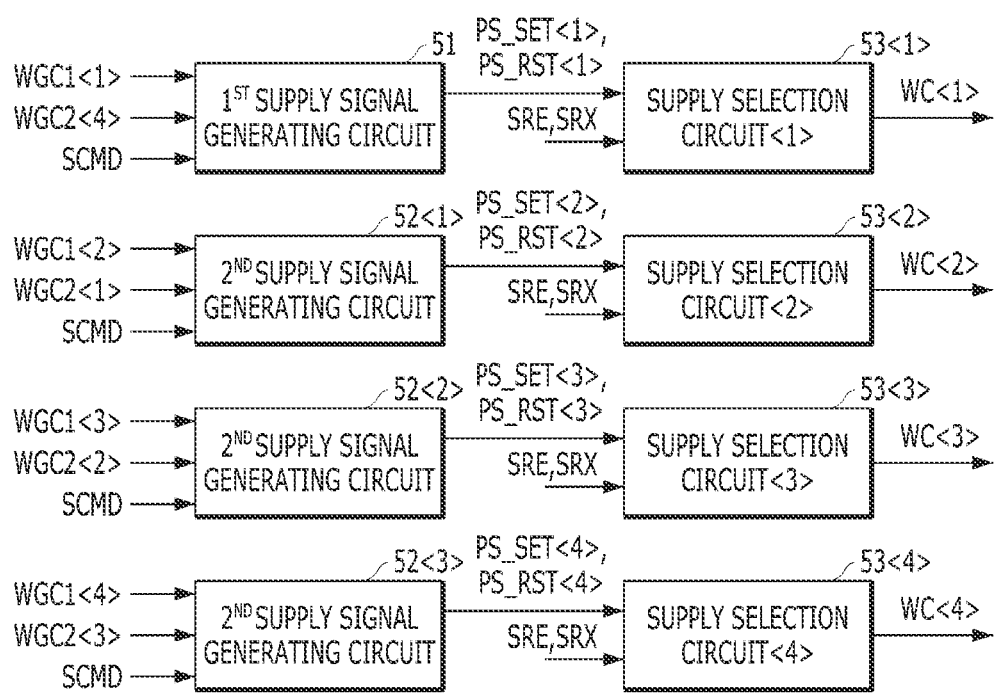
FIG. 5 is a diagram schematically illustrating the structure of a supply control circuit illustrated in FIG. 1 in accordance with an embodiment of the present disclosure.

FIG. 5 is a diagram schematically illustrating the structure of the supply control circuit illustrated in FIG. 1 in accordance with an embodiment of the present disclosure.

Figure 6:
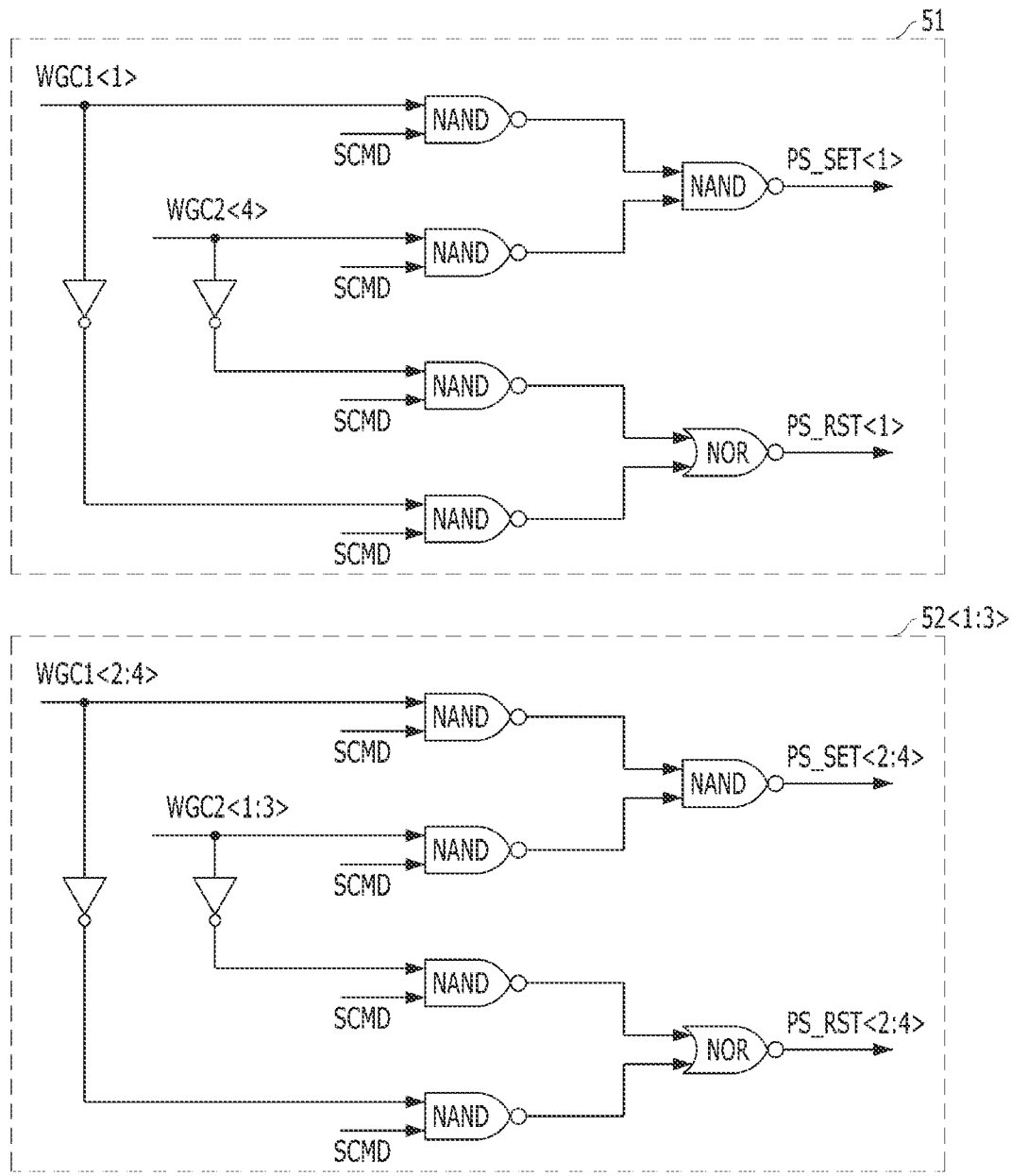
FIG. 6 is a diagram schematically illustrating the structure of a supply signal generating circuit among components of the supply control circuit illustrated in FIG. 5 in accordance with an embodiment of the present disclosure.

FIG. 6 is a diagram schematically illustrating the structure of a supply signal generating circuit among the components of the supply control circuit illustrated in FIG. 5 in accordance with an embodiment of the present disclosure.

Figure 7:
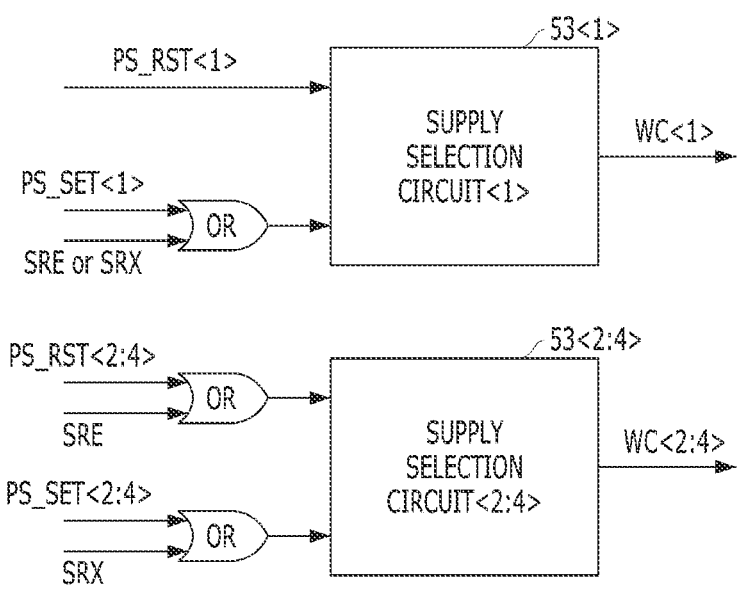
FIG. 7 is a diagram schematically illustrating the structure of a supply selection circuit among the components of the supply control circuit illustrated in FIG. 5 in accordance with an embodiment of the present disclosure.

FIG. 7 is a diagram schematically illustrating the structure of a supply selection circuit among the components of the supply control circuit illustrated in FIG. 5 in accordance with an embodiment of the present disclosure.

As described with reference to FIG. 1, the SUPPLY CONTROL CIRCUIT 15 may activate two signals corresponding to the current refresh address group and the subsequent refresh address group selected by the GROUP MANAGEMENT CIRCUIT 14 among the N group control signals WC<1:4> and deactivate the remaining signals in the section in which the self-refresh operation is performed. That is, the SUPPLY CONTROL CIRCUIT 15 may activate two of the N group control signals WC<1:4> in response to activation of one of the N current group signals WGC1<1:4> and activation of one of the N subsequent group signals WGC2<1:4> by the GROUP MANAGEMENT CIRCUIT 14. Consequently, the supply of power to a set number of word line control circuits corresponding to each of the current refresh address group and the subsequent refresh address group among the plurality of word line control circuits WL CC<1:16> may be enabled in response to the two activated group control signals. Furthermore, the supply of power to the remaining word line control circuits except for the current refresh address group and the subsequent refresh address group among the plurality of word line control circuits WL CC<1:16> may be disabled in response to the remaining deactivated group control signals.

Furthermore, after entering the self-refresh operation section, before a first refresh address RADD is generated by the REFRESH CONTROL CIRCUIT 13, the SUPPLY CONTROL CIRCUIT 15 may activate the first group control signal WC<1> corresponding to the first refresh address group of the N refresh address groups among the N group control signals WC<1:4>, and deactivate the remaining group control signals WC<2:4>. That is, the SUPPLY CONTROL CIRCUIT 15 may activate the first group control signal WC<1> corresponding to the first refresh address group of the N refresh address groups and deactivate the remaining group control signals WC<2:4> in response to the entry command SRE corresponding to entry into the self-refresh operation section. Consequently, the supply of power to a set number of word line control circuits corresponding to the first refresh address group among the plurality of word line control circuits WL CC<1:16> may be enabled in response to the activated first group control signal WC<1>. Furthermore, the supply of power to a set number of word line control circuits corresponding to the second to N refresh address groups among the plurality of word line control circuits WL CC<1:16> may be disabled in response to the remaining deactivated group control signals WC<2:4>.

Furthermore, the SUPPLY CONTROL CIRCUIT 15 may activate all N group control signals WC<1:4> in the section in which the auto-refresh operation is performed. That is, the SUPPLY CONTROL CIRCUIT 15 may activate all N group control signals WC<1:4> in response to exit from the self-refresh section and entry into the auto-refresh section, and then maintain this state until exit from the auto-refresh section and entry into the self-refresh section. That is, the SUPPLY CONTROL CIRCUIT 15 may activate all N group control signals WC<1:4> in response to the exit command SRX applied corresponding to the exit from the self-refresh section, and maintain this state until the entry command SRE corresponding to entry into the self-refresh section is applied. Consequently, in the section in which the auto-refresh operation is performed, the supply of power to the plurality of word line control circuits WL CC<1:16> may be enabled in response to the activated N group control signals WC<1:4>. That is, the supply of power to the plurality of word line control circuits WL CC<1:16> may be enabled in response to exit from the self-refresh section and entry into the auto-refresh section, and then may be maintained until exit from the auto-refresh section and entry into the self-refresh section.

Referring to FIG. 5, the SUPPLY CONTROL CIRCUIT 15 may include a first supply signal generating circuit $1^{st}$ SUPPLY SIGNAL GENERATING CIRCUIT 51, N−1 second supply signal generating circuits $2^{nd}$ SUPPLY SIGNAL GENERATING CIRCUITS 52<1:3>, and N supply selection circuits SUPPLY SELECTION CIRCUITS 53<1:4>.

For reference, since the description has been made on that N is 4, the following description is given on that N is 4.

The 1$^{st}$ SUPPLY SIGNAL GENERATING CIRCUIT 51 may generate first supply signals PS_SET<1> and PS_RST<1> among four supply signals PS_SET<1:4> and PS_RST<1:4> in response to the self-refresh command SCMD and the first current group signal WGC1<1> and the fourth subsequent group signal WGC2<4> indicating the first refresh address group of the four refresh address groups.

That is, the 1$^{st}$ SUPPLY SIGNAL GENERATING CIRCUIT 51 may activate the first supply signals PS_SET<1> and PS_RST<1> among the four supply signals PS_SET<1:4> and PS_RST<1:4> in response to input of the self-refresh command SCMD in a state in which one of the first current group signal WGC1<1> and the fourth subsequent group signal WGC2<4> indicating the first refresh address group of the four refresh address groups is activated.

Referring to FIG. 5 and FIG. 6 together, the 1$^{st}$ SUPPLY SIGNAL GENERATING CIRCUIT 51 may include three NAND gates NAND for toggling set signals PS_SET<1:4> of the first first-supply signals PS_SET<1> and PS_RST<1> when the self-refresh command SCMD is inputted in the state in which the first current group signal WGC1<1> is activated and when the self-refresh command SCMD is inputted in the state in which the fourth subsequent group signal WGC2<4> is activated. Furthermore, the 1$^{st}$ SUPPLY SIGNAL GENERATING CIRCUIT 51 may include two NAND gates NAND and one NOR gate NOR for toggling a reset signal PS_RST<1> of the first first-supply signals PS_SET<1> and PS_RST<1> when the self-refresh command SCMD is inputted in the state in which the first current group signal WGC1<1> is deactivated and when the self-refresh command SCMD is inputted in the state in which the fourth subsequent group signal WGC2<4> is deactivated.

Referring to FIG. 5, three 2$^{nd}$ SUPPLY SIGNAL GENERATING CIRCUITS 52<1:3> may generate second to fourth supply signals PS_SET<2:4> and PS_RST<2:4> among the four supply signals PS_SET<1:4> and PS_RST<1:4> in response to the self-refresh command SCMD and the second to fourth current group signals WGC1<2:4> and the first to third subsequent group signals WGC2<1:3> respectively indicating the second to fourth refresh address groups of the four refresh address groups.

That is, each of the three 2$^{nd}$ SUPPLY SIGNAL GENERATING CIRCUITS 52<1:3> may activate each of the second to fourth supply signals PS_SET<2:4> and PS_RST<2:4> among the four supply signals PS_SET<1:4> and PS_RST<1:4> in response to the input of the self-refresh command SCMD in a state in which one of each of the second to fourth current group signals WGC1<2:4> and each of the first to third subsequent group signals WGC2<1:3> indicating the second to fourth refresh address groups of the four refresh address groups is activated.

Specifically, among the three 2$^{nd}$ SUPPLY SIGNAL GENERATING CIRCUITS 52<1:3>, the first 2$^{nd}$ SUPPLY SIGNAL GENERATING CIRCUIT 52<1> may activate the second supply signals PS_SET<2> and PS_RST<2> in response to the input of the self-refresh command SCMD in a state in which one of the second current group signal WGC1<2> and the first subsequent group signal WGC2<1> is activated.

Furthermore, among the three 2$^{nd}$ SUPPLY SIGNAL GENERATING CIRCUITS 52<1:3>, the second 2$^{nd}$ SUPPLY SIGNAL GENERATING CIRCUIT 52<2> may activate the third supply signals PS_SET<3> and PS_RST<3> in response to the input of the self-refresh command SCMD in a state in which one of the third current group signal WGC1<3> and the second subsequent group signal WGC2<2> is activated.

Likewise, among the three 2$^{nd}$ SUPPLY SIGNAL GENERATING CIRCUITS 52<1:3>, the third 2$^{nd}$ SUPPLY SIGNAL GENERATING CIRCUIT 52<3> may activate the fourth supply signals PS_SET<4> and PS_RST<4> in response to the input of the self-refresh command SCMD in a state in which one of the fourth current group signal WGC1<4> and the third subsequent group signal WGC2<3> is activated.

Referring to FIG. 5 and FIG. 6 together, among the three 2$^{nd}$ SUPPLY SIGNAL GENERATING CIRCUITS 52<1:3>, the first 2$^{nd}$ SUPPLY SIGNAL GENERATING CIRCUIT 52<1> may include three NAND gates NAND for toggling the set signal PS_SET<2> of the second first-supply signals PS_SET<2> and PS_RST<2> when the self-refresh command SCMD is inputted in the state in which the second current group signal WGC1<2> is activated and when the self-refresh command SCMD is inputted in the state in which the first subsequent group signal WGC2<1> is activated. Furthermore, the first 2$^{nd}$ SUPPLY SIGNAL GENERATING CIRCUIT 52<1> may include two NAND gates NAND and one NOR gate NOR for toggling the reset signal PS_RST<2> of the second first-supply signals PS_SET<2> and PS_RST<2> when the self-refresh command SCMD is inputted in the state in which the second current group signal WGC1<2> is deactivated and when the self-refresh command SCMD is inputted in the state in which the first subsequent group signal WGC2<1> is deactivated.

Furthermore, among the three 2$^{nd}$ SUPPLY SIGNAL GENERATING CIRCUITS 52<1:3>, the second 2$^{nd}$ SUPPLY SIGNAL GENERATING CIRCUIT 52<2> may include three NAND gates NAND for toggling the set signal PS_SET<3> of the third first-supply signals PS_SET<3> and PS_RST<3> when the self-refresh command SCMD is inputted in the state in which the third current group signal WGC1<3> is activated and when the self-refresh command SCMD is inputted in the state in which the second subsequent group signal WGC2<2> is activated. Furthermore, the second 2$^{nd}$ SUPPLY SIGNAL GENERATING CIRCUIT 52<2> may include two NAND gates NAND and one NOR gate NOR for toggling the reset signal PS_RST<3> of the third first-supply signals PS_SET<3> and PS_RST<3> when the self-refresh command SCMD is inputted in the state in which the third current group signal WGC1<3> is deactivated and when the self-refresh command SCMD is inputted in the state in which the second subsequent group signal WGC2<2> is deactivated.

Likewise, among the three 2$^{nd}$ SUPPLY SIGNAL GENERATING CIRCUITS 52<1:3>, the third 2$^{nd}$ SUPPLY SIGNAL GENERATING CIRCUIT 52<3> may include three NAND gates NAND for toggling the set signal PS_SET<4> of the fourth first-supply signals PS_SET<4> and PS_RST<4> when the self-refresh command SCMD is inputted in the state in which the fourth current group signal WGC1<4> is activated and when the self-refresh command SCMD is inputted in the state in which the third subsequent group signal WGC2<3> is activated. Furthermore, the third 2$^{nd}$ SUPPLY SIGNAL GENERATING CIRCUIT 52<3> may include two NAND gates NAND and one NOR gate NOR for toggling the reset signal PS_RST<4> of the fourth first-supply signals PS_SET<4> and PS_RST<4> when the self-refresh command SCMD is inputted in the state in which the fourth current group signal WGC1<4> is deactivated and when the self-refresh command SCMD is inputted in the state in which the third subsequent group signal WGC2<3> is deactivated.

Referring to FIG. 5, four SUPPLY SELECTION CIRCUITS 53<1:4> may select whether to activate the four group control signals WC<1:4>, respectively, in order to selectively supply power to a set number of word line control circuits corresponding to each of the four refresh address groups among the plurality of word line control circuits WL CC<1:16> in response to the entry command SRE applied at the time of entry into the self-refresh section, the exit command SRX applied at the time of exit from the self-refresh section, and each of the four supply signals PS_SET<1:4> and PS_RST<1:4>.

Specifically, among the four SUPPLY SELECTION CIRCUITS 53<1:4>, the first SUPPLY SELECTION CIRCUIT 53<1> may activate the first group control signal WC<1> in order to enable the supply of power to a set number of word line control circuits corresponding to the first refresh address group among the plurality of word line control circuits WL CC<1:16> in response to the toggling of the set signal PS_SET<1> of the first supply signals PS_SET<1> and PS_RST<1> or the reception of the entry command SRE or the exit command SRX. Furthermore, the first SUPPLY SELECTION CIRCUIT 53<1> may deactivate the first group control signal WC<1> in order to disable the supply of power to a set number of word line control circuits corresponding to the first refresh address group among the plurality of word line control circuits WL CC<1:16> in response to the toggling of the reset signal PS_RST<1> of the first supply signals PS_SET<1> and PS_RST<1>.

Furthermore, among the four SUPPLY SELECTION CIRCUITS 53<1:4>, the second to fourth SUPPLY SELECTION CIRCUITS 53<2:4> may activate each of the second to fourth group control signals WC<2:4>, respectively, in order to enable the supply of power to a set number of word line control circuits corresponding to each of the second to fourth refresh address groups among the plurality of word line control circuits WL CC<1:16> in response to the toggling of the set signals PS_SET<2:4> of the second to fourth supply signals PS_SET<2:4> and PS_RST<2:4> or the reception of the exit command SRX. Furthermore, each of the second to fourth SUPPLY SELECTION CIRCUITS 53<2:4> may deactivate each of the second to fourth group control signals WC<2:4> in order to disable the supply of power to a set number of word line control circuits corresponding to each of the second to fourth refresh address groups among the plurality of word line control circuits WL CC<1:16> in response to the toggling of the reset signals PS_RST<2:4> of the second to fourth supply signals PS_SET<2:4> and PS_RST<2:4> or the reception of the entry command SRE.

More specifically, the second SUPPLY SELECTION CIRCUIT 53<2> may activate the second group control signal WC<2> in order to enable the supply of power to a set number of word line control circuits corresponding to the second refresh address group among the plurality of word line control circuits WL CC<1:16> in response to the toggling of the set signal PS_SET<2> of the second supply signals PS_SET<2> and PS_RST<2> or the reception of the exit command SRX. Furthermore, the second SUPPLY SELECTION CIRCUIT 53<2> may deactivate the second group control signal WC<2> in order to disable the supply of power to the set number of word line control circuits corresponding to the second refresh address group among the plurality of word line control circuits WL CC<1:16> in response to the toggling of the reset signal PS_RST<2> of the second supply signals PS_SET<2> and PS_RST<2> or the reception of the entry command SRE.

Furthermore, the third SUPPLY SELECTION CIRCUIT 53<3> may activate the third group control signal WC<3> in order to enable the supply of power to a set number of word line control circuits corresponding to the third refresh address group among the plurality of word line control circuits WL CC<1:16> in response to the toggling of the set signal PS_SET<3> of the third supply signals PS_SET<3> and PS_RST<3> or the reception of the exit command SRX. Furthermore, the third SUPPLY SELECTION CIRCUIT 53<3> may deactivate the third group control signal WC<3> in order to disable the supply of power to the set number of word line control circuits corresponding to the third refresh address group among the plurality of word line control circuits WL CC<1:16> in response to the toggling of the reset signal PS_RST<3> of the third supply signals PS_SET<3> and PS_RST<3> or the reception of the entry command SRE.

Likewise, the fourth SUPPLY SELECTION CIRCUIT 53<4> may activate the fourth group control signal WC<4> in order to enable the supply of power to a set number of word line control circuits corresponding to the fourth refresh address group among the plurality of word line control circuits WL CC<1:16> in response to the toggling of the set signal PS_SET<4> of the fourth supply signals PS_SET<4> and PS_RST<4> or the reception of the exit command SRX. Furthermore, the fourth SUPPLY SELECTION CIRCUIT 53<4> may deactivate the fourth group control signal WC<4> in order to disable the supply of power to the set number of word line control circuits corresponding to the fourth refresh address group among the plurality of word line control circuits WL CC<1:16> in response to the toggling of the reset signal PS_RST<4> of the fourth supply signals PS_SET<4> and PS_RST<4> or the reception of the entry command SRE.

Referring to FIG. 5 and FIG. 7 together, among the four SUPPLY SELECTION CIRCUITS 53<1:4>, the first SUPPLY SELECTION CIRCUIT 53<1> may include one OR gate OR for receiving the set signal PS_SET<1> of the first supply signals PS_SET<1> and PS_RST<1>, the entry command SRE, and the exit command SRX to perform an OR operation on the received signals, and a set-reset (SR) latch for receiving an output result of the OR gate OR through a reset input terminal thereof to activate, to logic low, the first group control signal WC<1> outputted through an output terminal and receiving the reset signal PS_RST<1> of the first supply signals PS_SET<1> and PS_RST<1> through a set input terminal thereof to deactivate, to logic high, the first group control signal WC<1> outputted through the output terminal thereof.

Furthermore, among the four SUPPLY SELECTION CIRCUITS 53<1:4>, the second SUPPLY SELECTION CIRCUIT 53<2> may include one OR gate OR for receiving the set signal PS_SET<1> of the second supply signals PS_SET<2> and PS_RST<2> and the exit command SRX to perform an OR operation on the received signals, another one OR gate OR for receiving an output result of the OR gate OR through a reset input terminal thereof to activate, to logic low, the second group control signal WC<2> outputted through an output terminal thereof and receiving the reset signal PS_RST<2> of the second supply signals PS_SET<2> and PS_RST<2> and the entry command SRE to perform an OR operation on the received signals, and an SR latch for receiving an output result of the another OR gate OR through a set input terminal thereof to deactivate, to logic high, the second group control signal WC<2> outputted through the output terminal thereof.

Furthermore, among the four SUPPLY SELECTION CIRCUITS 53<1:4>, the third SUPPLY SELECTION CIRCUIT 53<3> may include one OR gate OR for receiving the set signal PS_SET<3> of the third supply signals PS_SET<3> and PS_RST<3> and the exit command SRX to perform an OR operation on the received signals, another one OR gate OR for receiving an output result thereof of the OR gate OR through a reset input terminal thereof to activate, to logic low, the third group control signal WC<3> outputted through an output terminal thereof and receiving the reset signal PS_RST<3> of the third supply signals PS_SET<3> and PS_RST<3> and the entry command SRE to perform an OR operation on the received signals, and an SR latch for receiving an output result of the another OR gate OR through a set input terminal thereof to deactivate, to logic high, the third group control signal WC<3> outputted through the output terminal thereof.

Furthermore, among the four SUPPLY SELECTION CIRCUITS 53<1:4>, the fourth SUPPLY SELECTION CIRCUIT 53<4> may include one OR gate OR for receiving the set signal PS_SET<4> of the fourth supply signals PS_SET<4> and PS_RST<4> and the exit command SRX to perform an OR operation on the received signals, another one OR gate OR for receiving an output result of the OR gate OR through a reset input terminal thereof to activate, to logic low, the fourth group control signal WC<4> outputted through an output terminal thereof and receiving the reset signal PS_RST<4> of the fourth supply signals PS_SET<4> and PS_RST<4> and the entry command SRE to perform an OR operation on the received signals, and an SR latch for receiving an output result of the another OR gate OR through a set input terminal thereof to deactivate, to logic high, the fourth group control signal WC<4> outputted through the output terminal thereof.

Figure 8:
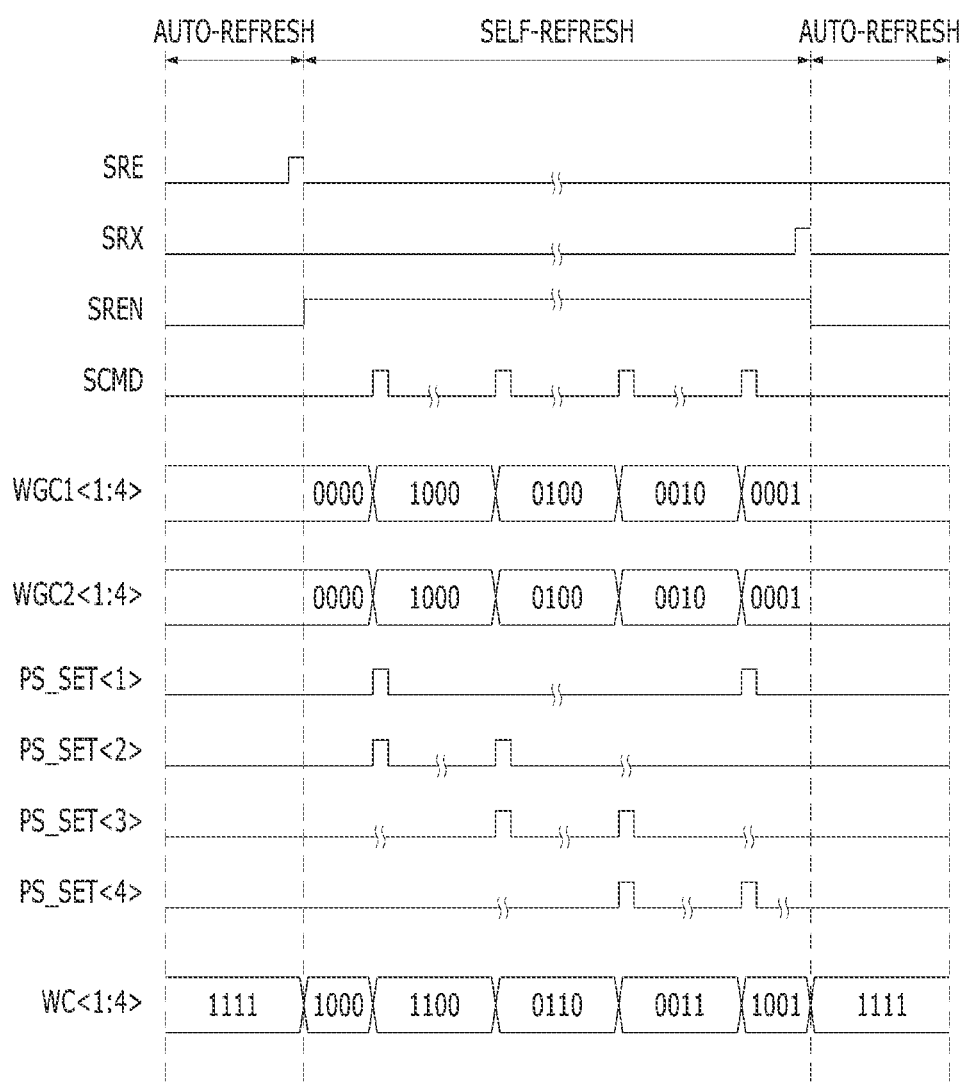
FIG. 8 is a diagram for describing an operation of the memory device in accordance with an embodiment of the present disclosure illustrated in FIG. 1.

FIG. 8 is a diagram for describing the operation of the memory device in accordance with an embodiment of the present disclosure illustrated in FIG. 1.

Referring to FIG. 8, it can be seen that refresh addresses RADD generated for a refresh operation are classified into N refresh address groups in a state of entry into a self-refresh section SELF-REFRESH. For reference, since the description has been made on that N is 4, the following description is given on that N is 4.

Specifically, in an auto-refresh section AUTO-REFRESH, addresses RADD generated for a refresh operation are not classified into refresh address groups. Therefore, a state in which the four group control signals WC<1:4> are all activated (1111) may be maintained. That is, power supplied to all the plurality of word line control circuits WL CC<1:16> for controlling the plurality of word lines WL<1:16>, respectively, may be enabled.

Before a first refresh address RADD is generated after the entry into the self-refresh section SELF-REFRESH, the first group control signal WC<1> of the four group control signals WC<1:4> may be activated and the remaining group control signals WC<2:4> may be deactivated (1000) in order to enable power supplied to a set number of word line control circuits corresponding to the first refresh address group among the plurality of word line control circuits WL CC<1:16>. At this time, before the first refresh address RADD is generated after the entry into the self-refresh section SELF-REFRESH, values for the four current group signals WGC1<1:4> and the four subsequent group signals WGC2<1:4> have not yet been determined (0000).

Then, when the first refresh address RADD is generated after the entry into the self-refresh section SELF-REFRESH, since the generated refresh address RADD is included in the first refresh address group. Therefore, the first current group signal WGC1<1> of the four current group signals WGC1<1:4> may be activated and the remaining current group signals WGC1<2:4> may be deactivated (1000). Furthermore, since the four subsequent group signals WGC2<1:4> may be generated by signal-shifting the four current group signals WGC1<1:4>, the first subsequent group signal WGC2<1> of the four subsequent group signals WGC2<1:4> may be activated and the remaining subsequent group signals WGC2<2:4> may be deactivated (1000).

In this way, since the first current group signal WGC1<1> is activated and the remaining current group signals WGC1<2:4> are deactivated (1000), the set signal PS_SET<1> of the first first-supply signals PS_SET<1> and PS_RST<1> among the four first supply signals PS_SET<1:4> and PS_RST<1:4> may be toggled.

Furthermore, since the first subsequent group signal WGC2<1> is activated and the remaining subsequent group signals WGC2<2:4> are deactivated (1000), the set signal PS_SET<2> of the second first-supply signals PS_SET<2> and PS_RST<2> among the four first supply signals PS_SET<1:4> and PS_RST<1:4> may be toggled.

In this way, as the set signals PS_SET<1:2> of the first and second first-supply signals PS_SET<1:2> and PS_RST<1:2> among the four first supply signals PS_SET<1:4> and PS_RST<1:4> are toggled, the first and second group control signals WC<1:2> of the four group control signals WC<1:4> may be activated and the third and fourth group control signals WC<3:4> may be deactivated (1100). Accordingly, the supply of power to a set number of word line control circuits corresponding to the first and second refresh address groups of the four refresh address groups among the plurality of word line control circuits WL CC<1:16> may be enabled, and the supply of power to a set number of word line control circuits corresponding to the third and fourth refresh address groups may be disabled.

Then, when a refresh address RADD corresponding to the second refresh address group is generated in the self-refresh section SELF-REFRESH, the second current group signal WGC1<2> of the four current group signals WGC1<1:4> may be activated and the remaining current group signals WGC1<1, 3:4> may be deactivated (0100). Furthermore, since the four subsequent group signals WGC2<1:4> may be generated by signal-shifting the four current group signals WGC1<1:4>, the second subsequent group signal WGC2<2> of the four subsequent group signals WGC2<1:4> may be activated and the remaining subsequent group signals WGC2<1, 3:4> may be deactivated (0100).

In this way, since the second current group signal WGC1<2> is activated and the remaining current group signals WGC1<1, 3:4> are deactivated (0100), the set signal PS_SET<2> of the second first-supply signals PS_SET<2> and PS_RST<2> among the four first supply signals PS_SET<1:4> and PS_RST<1:4> may be toggled.

Furthermore, since the second subsequent group signal WGC2<2> is activated and the remaining subsequent group signals WGC2<1, 3:4> are deactivated (0100), the set signal PS_SET<3> of the third first-supply signals PS_SET<3> and PS_RST<3> among the four first supply signals PS_SET<1:4> and PS_RST<1:4> may be toggled.

In this way, as the set signals PS_SET<2:3> of the second and third first-supply signals PS_SET<2:3> and PS_RST<2:3> among the four first supply signals PS_SET<1:4> and PS_RST<1:4> are toggled, the second and third group control signals WC<2:3> of the four group control signals WC<1:4> may be activated and the first and fourth group control signals WC<1, 4> may be deactivated (0110). Accordingly, the supply of power to a set number of word line control circuits corresponding to the second and third refresh address groups of the four refresh address groups among the plurality of word line control circuits WL CC<1:16> may be enabled, and the supply of power to a set number of word line control circuits corresponding to the first and fourth refresh address groups may be disabled.

Then, when a refresh address RADD corresponding to the third refresh address group is generated in the self-refresh section SELF-REFRESH, the third current group signal WGC1<3> of the four current group signals WGC1<1:4> may be activated and the remaining current group signals WGC1<1:2, 4> may be deactivated (0010). Furthermore, since the four subsequent group signals WGC2<1:4> may be generated by signal-shifting the four current group signals WGC1<1:4>, the third subsequent group signal WGC2<3> of the four subsequent group signals WGC2<1:4> may be activated and the remaining subsequent group signals WGC2<1:2, 4> may be deactivated (0010).

In this way, since the third current group signal WGC1<3> is activated and the remaining current group signals WGC1<1:2, 4> are deactivated (0010), the set signal PS_SET<3> of the third first-supply signals PS_SET<3> and PS_RST<3> among the four first supply signals PS_SET<1:4> and PS_RST<1:4> may be toggled.

Furthermore, since the third subsequent group signal WGC2<3> is activated and the remaining subsequent group signals WGC2<1:2, 4> are deactivated (0010), the set signal PS_SET<4> of the fourth first-supply signals PS_SET<4> and PS_RST<4> among the four first supply signals PS_SET<1:4> and PS_RST<1:4> may be toggled.

In this way, as the set signals PS_SET<3:4> of the third and fourth first-supply signals PS_SET<3:4> and PS_RST<3:4> among the four first supply signals PS_SET<1:4> and PS_RST<1:4> are toggled, the third and fourth group control signals WC<3:4> of the four group control signals WC<1:4> may be activated and the first and second group control signals WC<1:2> may be deactivated (0011). Accordingly, the supply of power to a set number of word line control circuits corresponding to the third and fourth refresh address groups of the four refresh address groups among the plurality of word line control circuits WL CC<1:16> may be enabled, and the supply of power to a set number of word line control circuits corresponding to the first and second refresh address groups may be disabled.

Then, when a refresh address RADD corresponding to the fourth refresh address group is generated in the self-refresh section SELF-REFRESH, the fourth current group signal WGC1<4> of the four current group signals WGC1<1:4> may be activated and the remaining current group signals WGC1<1:3> may be deactivated (0001). Furthermore, since the four subsequent group signals WGC2<1:4> may be generated by signal-shifting the four current group signals WGC1<1:4>, the fourth subsequent group signal WGC2<4> of the four subsequent group signals WGC2<1:4> may be activated and the remaining subsequent group signals WGC2<1:3> may be deactivated (0001).

In this way, since the fourth current group signal WGC1<4> is activated and the remaining current group signals WGC1<1:3> are deactivated (0001), the set signal PS_SET<4> of the fourth first-supply signals PS_SET<4> and PS_RST<4> among the four first supply signals PS_SET<1:4> and PS_RST<1:4> may be toggled.

Furthermore, since the fourth subsequent group signal WGC2<4> is activated and the remaining subsequent group signals WGC2<1:3> are deactivated (0001), the set signal PS_SET<1> of the first first-supply signals PS_SET<1> and PS_RST<1> among the four first supply signals PS_SET<1:4> and PS_RST<1:4> may be toggled.

In this way, as the set signals PS_SET<1, 4> of the first and fourth first-supply signals PS_SET<1, 4> and PS_RST<1, 4> among the four first supply signals PS_SET<1:4> and PS_RST<1:4> are toggled, the first and fourth group control signals WC<1, 4> of the four group control signals WC<1:4> may be activated and the second and third group control signals WC<2:3> may be deactivated (1001). Accordingly, the supply of power to a set number of word line control circuits corresponding to the first and fourth refresh address groups of the four refresh address groups among the plurality of word line control circuits WL CC<1:16> may be enabled, and the supply of power to a set number of word line control circuits corresponding to the second and third refresh address groups may be disabled.

Then, in re-entry into the auto-refresh section AUTO-REFRESH after exit from the self-refresh section SELF-REFRESH, the addresses RADD generated for the refresh operation are not classified into refresh address groups. Therefore, the state (1111) in which the four group control signals WC<1:4> are all activated may be maintained. That is, power supplied to all the plurality of word line control circuits WL CC<1:16> for controlling the plurality of word lines WL<1:16>, respectively, may be enabled.

The present disclosure described above is not limited to the aforementioned embodiments and the accompanying drawings, and it will be apparent to those skilled in the art to which the present disclosure pertains that various replacements, modifications, and changes can be made without departing from the technical scope of the present disclosure.

For example, the position and the type of a logic gate and a transistor illustrated in the aforementioned embodiments should be differentially realized according to the polarity of an inputted signal.

While the present disclosure has been illustrated and described with respect to specific embodiments, the disclosed embodiments are provided for the description, and not intended to be restrictive. Further, it is noted that the present disclosure may be achieved in various ways through substitution, change, and modification that fall within the scope of the following claims, as those skilled in the art will recognize in light of the present disclosure. Furthermore, the embodiments may be combined to form additional embodiments.

What is claimed is:

1. A memory device comprising:
   a refresh control circuit configured to generate a self-refresh command and a refresh address every set cycle in order to refresh cells connected to a plurality of word lines in a predetermined order in a self-refresh section;
   a plurality of word line control circuits respectively corresponding to the plurality of word lines and each configured to control a refresh operation of the cells connected to a corresponding word line of the plurality of word lines in response to the self-refresh command and the refresh address;
   a group management circuit configured to:
   classify refresh addresses to be generated by the refresh control circuit into N refresh address groups by grouping, by a set number, the refresh addresses to be generated by the refresh control circuit, and select, from the N refresh address groups, a current refresh address group including a refresh address to be currently generated by the refresh control circuit during the self-refresh section and a subsequent refresh address group including a refresh address to be generated after the current refresh address group according to the predetermined order;

a row control circuit configured to:

group the plurality of word line control circuits by the set number, and match the grouped word line control circuits to respective N group control signals respectively corresponding to the N refresh address groups, thereby controlling whether to enable the respective word line control circuits; and a supply control circuit configured to activate two group control signals respectively corresponding to the current and subsequent refresh address groups and deactivate remaining group control signals among the N group control signals during the self-refresh section.

2. The memory device of claim 1, wherein the group management circuit comprises:

an address decoder configured to:

classify the refresh addresses into the N refresh address groups by decoding a specific bit value of a refresh address most recently generated by the refresh control circuit before entering the self-refresh section, and generate N current group signals respectively indicating the N refresh address groups by decoding the specific bit value of the currently generated address, thereby activating only one current group signal indicating the current refresh address group and deactivating remaining N−1 current group signals among the N current group signals; and a shifter configured to generate N subsequent group signals respectively indicating the N refresh address groups by signal-shifting the N current group signals, thereby activating only one subsequent group signal indicating the subsequent refresh address group and deactivating remaining N−1 subsequent group signals among the N subsequent group signals.

3. The memory device of claim 2, wherein the row control circuit groups, when entering the self-refresh section, the plurality of word line control circuits by the set number according to a result of decoding the specific bit value of the most recently generated refresh address, and wherein the row control circuit matches the grouped word line control circuits respectively to the N group control signals.

4. The memory device of claim 3, wherein the supply control circuit comprises:

a first supply signal generating circuit configured to generate first supply signals among N supply signals in response to the self-refresh command and a first current group signal indicating a first refresh address group of the N refresh address groups and an $N^{th}$ subsequent group signal;

N−1 second supply signal generating circuits configured to generate second to $n^{th}$ supply signals among the N supply signals in response to the self-refresh command and each of second to $n^{th}$ current group signals respectively indicating second to $n^{th}$ refresh address groups of the N refresh address groups and each of first to n−1$^{th}$ subsequent group signals; and N supply selection circuits configured to generate the N group control signals in response to an entry command applied at the time of entry into the self-refresh section, an exit command applied at the time of exit from the self-refresh section, and each of the N supply signals.

5. The memory device of claim 4, wherein the first supply signal generating circuit is further configured to toggle a set signal of the first supply signals in response to the self-refresh command in a state in which one of the first current group signal and the $N^{th}$ subsequent group signal is activated, and toggle a reset signal of the first supply signals in response to the self-refresh command in a state in which the first current group signal and the $N^{th}$ subsequent group signal are all deactivated.

6. The memory device of claim 5, wherein the N−1 second supply signal generating circuits are further configured to toggle set signals of the respective second to $n^{th}$ supply signals in response to the self-refresh command in a state in which one of each of the second to $n^{th}$ current group signals and each of first to n−1$^{th}$ subsequent group signals is activated, and toggle reset signals of the respective second to $n^{th}$ supply signals in response to the self-refresh command in a state in which the second to $n^{th}$ current group signals and first to n−1$^{th}$ subsequent group signals are all deactivated.

7. The memory device of claim 6, wherein the N supply selection circuits comprise:

a first supply selection circuit configured to:

activate, among the N group control signals, a first group control signal corresponding to the first refresh address group in response to the set signal of the first supply signals and reception of the entry command or the exit command, and deactivate the first group control signal in response to toggling of the reset signal of the first supply signals; and second to $n^{th}$ supply selection circuits configured to activate, among the N group control signals, each of second to $n^{th}$ group control signals corresponding to the second to $n^{th}$ refresh address groups in response to the set signals of the second to $n^{th}$ supply signals and reception of the exit command, and deactivate each of the second to $n^{th}$ group control signals in response to toggling of the reset signals of the second to $n^{th}$ supply signals and reception of the entry command.

8. The memory device of claim 3, wherein the refresh control circuit is further configured to generate the refresh address in response to an auto-refresh command inputted from an exterior in an auto-refresh section, wherein the plurality of word line control circuits is further configured to control a refresh operation of the cells respectively connected to the plurality of word lines in response to the auto-refresh command and the refresh address in the auto-refresh section, and wherein the supply control circuit is further configured to activate all the N group control signals in response to exit from the self-refresh section and entry into the auto-refresh section, and maintain the activation of all the N group control signals until exit from the auto-refresh section and entry into the self-refresh section.

9. The memory device of claim 8, wherein:

the group management circuit is further configured to classify the refresh addresses into the N refresh address groups by decoding, at a time of entering the self-refresh section, the specific bit value of the most recently generated refresh address, which has been used for a refresh operation in the auto-refresh section before entering the self-refresh section, and wherein the row control circuit is further configured to decode the specific bit value of the most recently generated refresh address at the time of entering the self-refresh section, and match the plurality of word line control circuits to the respective N group control signals by the set number.

10. The memory device of claim 3, wherein the supply control circuit is further configured to activate a first group control signal corresponding to a first refresh address group of the N refresh address groups among the N group control signals while deactivating remaining group control signals among the N group control signals, before a first refresh address is generated by the refresh control circuit after entering the self-refresh section.

11. A method of operating a memory device, the method comprising:

generating a self-refresh command and a refresh address every set cycle in order to refresh cells connected to a plurality of word lines in a predetermined order in a self-refresh section;

classifying refresh addresses to be generated in the predetermined order into N refresh address groups by grouping, by a set number, the refresh addresses to be generated;

grouping a plurality of word line control circuits for respectively controlling a plurality of word lines by the set number;

matching the grouped word line control circuits to respective N group control signals respectively corresponding to the N refresh address groups, thereby controlling whether to enable the plurality of word line control circuits;

selecting, from the N refresh address groups, a current refresh address group including a refresh address to be currently generated during the self-refresh section and a subsequent refresh address group including a refresh address to be generated after the current refresh address group according to the predetermined order; and activating two group control signals respectively corresponding to the current and subsequent refresh address groups and deactivating remaining group control signals among the N group control signals during the self-refresh section, wherein N is a natural number equal to or more than 2.

12. The method of claim 11, wherein classifying refresh addresses to be generated includes classifying the refresh addresses into N refresh address groups by decoding a specific bit value of a refresh address most recently generated before entering the self-refresh section.

13. The method of claim 12, wherein grouping a plurality of word line control circuits includes, when entering the self-refresh section, the plurality of word line control circuits are grouped by the set number according to a result of decoding the specific bit value of the most recently generated refresh address, and matching the grouped word line control circuits respectively to the N group control signals.

14. The method of claim 13, wherein selecting a current refresh address group including a refresh address to be currently generated comprises:

generating N current group signals respectively indicating the N refresh address groups by decoding the specific bit value of the currently generated refresh address, thereby activating only one current group signal indicating the current refresh address group and deactivating remaining N−1 current group signals among the N current group signals; and generating N subsequent group signals respectively indicating the N refresh address groups by signal-shifting the N current group signals, thereby activating only one subsequent group signal indicating the subsequent refresh address group and deactivating remaining N−1 subsequent group signals among the N subsequent group signals.

15. The method of claim 14, wherein activating two group control signals comprises:

controlling whether to activate, among the N group control signals, a first group control signal corresponding to a first refresh address group of the N refresh address groups in response to the self-refresh command and a first current group signal indicating the first refresh address group and an $N^{th}$ subsequent group signal; and controlling whether to activate, among the N group control signals, second to $N^{th}$ group control signals respectively corresponding to second to $N^{th}$ refresh address groups of the N refresh address groups in response to the self-refresh command and each of second to $N^{th}$ current group signals respectively indicating the second to $N^{th}$ refresh address groups and each of first to N−$1^{th}$ subsequent group signals.

16. The method of claim 13, further comprising:

generating the refresh address in response to an auto-refresh command inputted from an exterior in an auto-refresh section;

controlling a refresh operation of the cells respectively connected to the plurality of word lines in response to the auto-refresh command and the refresh address in the auto-refresh section;

activating all N group control signals in response to exit from the self-refresh section and entry into the auto-refresh section; and maintaining the activation of all N group control signals until exit from the auto-refresh section and entry into the self-refresh section.

17. The method of claim 16, further comprising classifying the refresh addresses into the N refresh address groups by decoding, at a time of entering the self-refresh section, the specific bit value of the most recently generated refresh address, which has been used for a refresh operation in the auto-refresh section before entering the self-refresh section.

18. The method of claim 17, further comprising:

decoding the specific bit value of the most recently generated refresh address at the time of entering the self-refresh section; and matching the plurality of word line control circuits to the respective N group control signals by the set number.

19. The method of claim 13, further comprising activating a first group control signal corresponding to a first refresh address group of the N refresh address groups among the N group control signals while deactivating remaining group control signals among the N group control signals, before a first refresh address is generated after entering the self-refresh section.

20. A memory device comprising:

N number of row groups of memory cells;

N number of refresh circuits each configured to be activated to sequentially refresh one or more rows within a corresponding row group of the N number of row groups; and a control circuit configured to sequentially activate the N number of refresh circuits in units of groups, one of which includes M number of refresh circuits, while deactivating remaining ones other than each of the activated groups among the N number of refresh circuits, wherein each of the activated groups includes, among the N number of refresh circuits, one or more current refresh circuits to be currently and sequentially activated and one or more subsequent refresh circuits to be sequentially activated after the current refresh circuits.

* * * * *